United States Patent
Ohshima et al.

(10) Patent No.: US 8,354,982 B2
(45) Date of Patent: *Jan. 15, 2013

(54) DISPLAY WITH MULTIPLE EMISSION LAYERS

(75) Inventors: Yoshinori Ohshima, Kanagawa-ken (JP); Shigehiro Masuji, Tokyo (JP); Naoto Hirohata, Yokohama (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 971 days.

This patent is subject to a terminal disclaimer.

(21) Appl. No.: 12/382,665

(22) Filed: Mar. 20, 2009

(65) Prior Publication Data

US 2009/0189834 A1    Jul. 30, 2009

Related U.S. Application Data

(62) Division of application No. 11/135,473, filed on May 24, 2005, now Pat. No. 7,528,810.

(30) Foreign Application Priority Data

| May 25, 2004 | (JP) | P2004-154887 |
| May 26, 2004 | (JP) | P2004-155373 |
| Jun. 7, 2004 | (JP) | P2004-168752 |
| Sep. 9, 2004 | (JP) | P2004-263088 |

(51) Int. Cl.
 *G09G 3/30* (2006.01)
(52) U.S. Cl. .......................... 345/77; 345/76
(58) Field of Classification Search .............. 345/76–83, 345/204–215; 315/169.1–169.4; 313/503–509
See application file for complete search history.

(56) References Cited

U.S. PATENT DOCUMENTS

| 4,999,618 | A * | 3/1991 | Inada et al. ............ 345/79 |
| 6,404,137 | B1 * | 6/2002 | Shodo .................. 315/169.1 |
| 7,123,220 | B2 * | 10/2006 | Hanari et al. ............ 345/77 |
| 7,315,293 | B2 * | 1/2008 | Ha et al. ................. 345/83 |
| 7,528,810 | B2 * | 5/2009 | Ohshima et al. .......... 345/77 |
| 2004/0196219 | A1 * | 10/2004 | Kaneko et al. ............ 345/76 |
| 2004/0196235 | A1 * | 10/2004 | Koyama et al. ........... 345/89 |
| 2006/0055643 | A1 * | 3/2006 | Sato et al. ............... 345/82 |

FOREIGN PATENT DOCUMENTS

| JP | 10-214060 | 8/1998 |
| JP | 11-73159 | 3/1999 |
| JP | 2003-280593 | 10/2003 |

OTHER PUBLICATIONS

Akimoto, H., et al.,"32.2: An Innovative Pixel-Driving Scheme for 64-Level Gray-Scale Full Color Active Matrix OLED Displays", *SID 02 Digest*, pp. 972-975 (2002).

* cited by examiner

*Primary Examiner* — Vijay Shankar
(74) *Attorney, Agent, or Firm* — Nath, Goldberg & Meyer; Jerald L. Meyer; Stanley N. Protigal

(57) ABSTRACT

A display has light emitting elements, a first driver, a power source, and a second driver. Each light emitting element includes "n" emission layers formed one over another to form a color dot in each pixel. The first driver drives the emission layers to emit light or no light. The power source passes a current through the first driver to the light emitting element. The second driver individually weights the n emission layers and makes the emission layers emit light so that each dot may express a gradation level.

7 Claims, 31 Drawing Sheets

LIGHT EMISSION

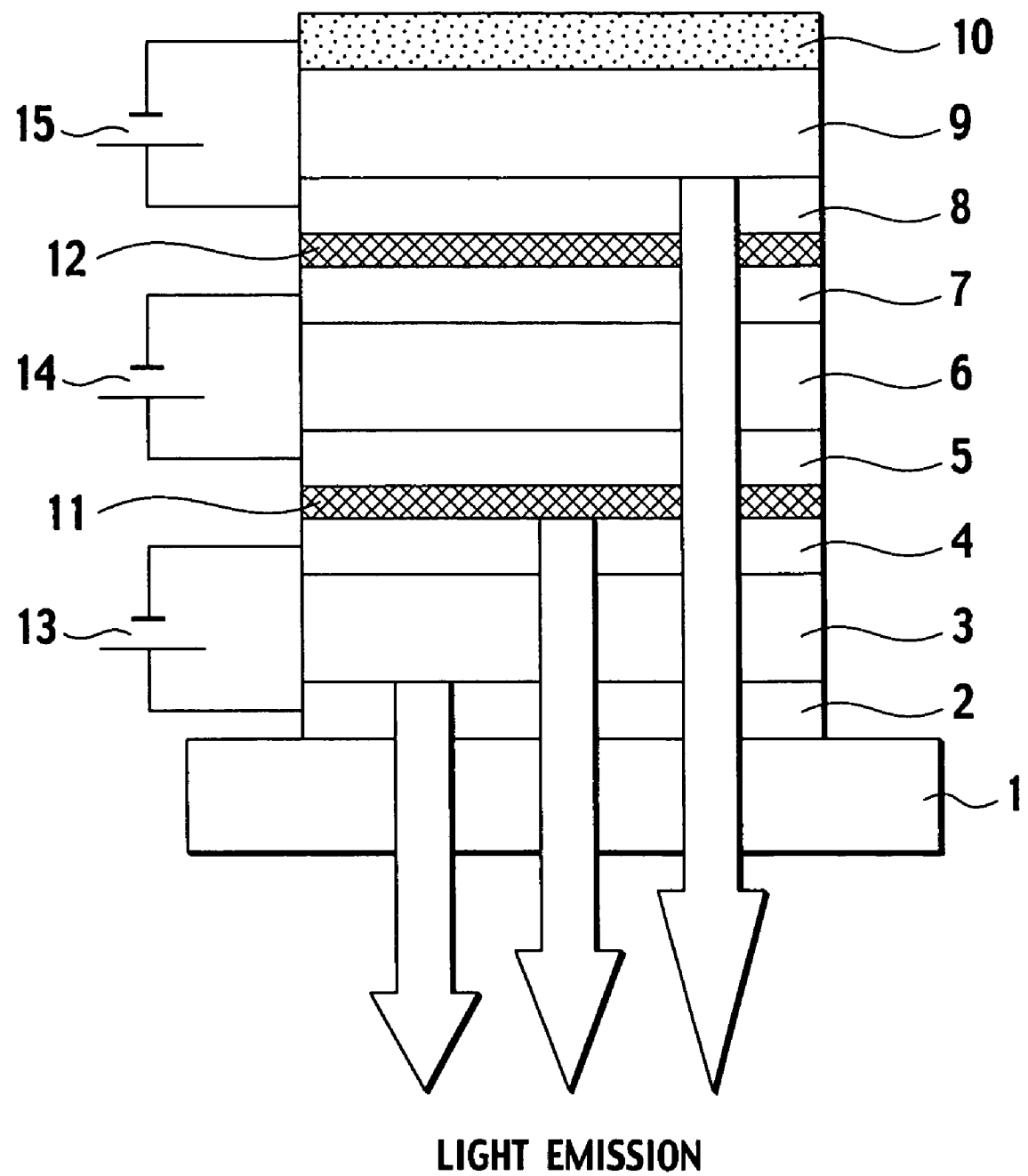

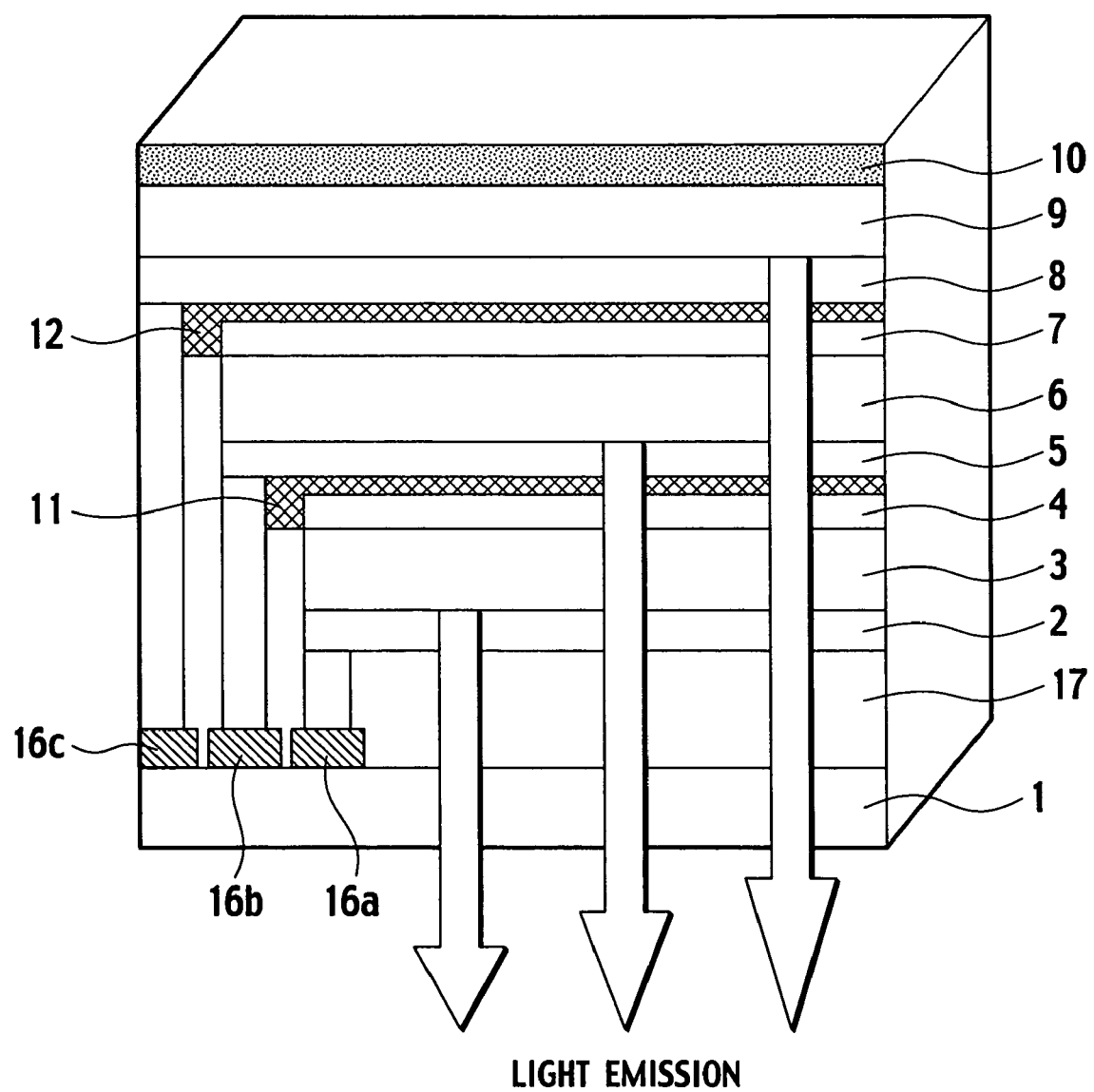

FIG.7A

| EMISSION LAYER | BRIGHTNESS WEIGHT |
|---|---|
| 1ST LAYER | 1 |
| 2ND LAYER | 2 |
| 3RD LAYER | 4 |

FIG.7B

| EMISSION LAYER | BRIGHTNESS WEIGHT |
|---|---|
| 1ST LAYER | 1 |
| 2ND LAYER | 2 |
| 3RD LAYER | 4 |
| 4TH LAYER | 8 |
| 5TH LAYER | 16 |

FIG.8

| | BRIGHTNESS WEIGHT | | |
|---|---|---|---|
| | 1ST LAYER | 2ND LAYER | 3RD LAYER |
| GRADATION LEVEL | 1 | 2 | 4 |
| 0 | | | |
| 1 | ● | | |
| 2 | | ● | |
| 3 | ● | ● | |
| 4 | | | ● |
| 5 | ● | | ● |
| 6 | | ● | ● |
| 7 | ● | ● | ● |

FIG.14A

| FRAME | CURRENT VALUE | | | TOTAL BRIGHTNESS |
|---|---|---|---|---|
| | 1ST LAYER | 2ND LAYER | 3RD LAYER | |
| 1 | 1 | 2 | 4 | 7 |
| 2 | 2 | 4 | 1 | 7 |
| 3 | 4 | 1 | 2 | 7 |
| 4 | 1 | 2 | 4 | 7 |
| 5 | 2 | 4 | 1 | 7 |
| 6 | 4 | 1 | 2 | 7 |
| 7 | 1 | 2 | 4 | 7 |
| ... | ... | ... | ... | ... |

FIG.14B

| FRAME | TIME LENGTH | | | TOTAL BRIGHTNESS |
|---|---|---|---|---|
| | 1ST LAYER | 2ND LAYER | 3RD LAYER | |
| 1 | 1 | 2 | 4 | 7 |
| 2 | 2 | 4 | 1 | 7 |
| 3 | 4 | 1 | 2 | 7 |
| 4 | 1 | 2 | 4 | 7 |
| 5 | 2 | 4 | 1 | 7 |
| 6 | 4 | 1 | 2 | 7 |
| 7 | 1 | 2 | 4 | 7 |
| ... | ... | ... | ... | ... |

FIG.14C

| FRAME | CURRENT VALUE | | | TIME LENGTH | | | TOTAL BRIGHTNESS |
|---|---|---|---|---|---|---|---|
| | 1ST LAYER | 2ND LAYER | 3RD LAYER | 1ST LAYER | 2ND LAYER | 3RD LAYER | |
| 1 | 1 | 3/2 | 2 | 1 | 4/3 | 2 | 7 |
| 2 | 3/2 | 2 | 1 | 4/3 | 2 | 1 | 7 |
| 3 | 2 | 1 | 3/2 | 2 | 1 | 4/3 | 7 |
| 4 | 3/2 | 2 | 1 | 4/3 | 2 | 1 | 7 |
| 5 | 2 | 3/2 | 2 | 2 | 4/3 | 1 | 7 |
| 6 | 1 | 2 | 3/2 | 2 | 1 | 4/3 | 7 |
| 7 | 2 | 3/2 | 1 | 1 | 4/3 | 2 | 7 |
| 8 | 1 | 2 | 3/2 | 4/3 | 2 | 1 | 7 |
| 9 | 3/2 | 1 | 2 | 1 | 4/3 | 2 | 7 |
| 10 | 1 | 3/2 | 2 | 4/3 | 2 | 1 | 7 |
| ... | ... | ... | ... | ... | ... | ... | ... |

LIGHT EMISSION

LIGHT EMISSION

LIGHT EMISSION

LIGHT EMISSION

DISPLAY WITH MULTIPLE EMISSION LAYERS

This is a Divisional Application of U.S. patent application Ser. No. 11/135,473 with the filing date of May 24, 2005, the entire content of which is hereby incorporated by reference in its entirety.

BACKGROUND OF THE INVENTION

1. Field of the Invention

The present invention relates to a display, and particularly, to a display such as an electroluminescence display with a plurality of emission layers laid one over another, to display gradational images.

2. Description of Related Art

Organic electroluminescence displays (OELDs) are drawing attention because they are very thin and are high in contrast, response speed, and viewing angles. Hereafter, the organic electroluminescence display is sometimes referred to as "organic EL display." The organic EL display uses organic compounds that demonstrate an electroluminescence effect to convert electricity into light. The organic EL display frequently employs an active matrix driving method to improve energy efficiency and reduce energy consumption. Due to these and other advantages, the organic EL display is regarded as a promising next-generation display.

FIGS. 1A and 1B show layer structures employed for conventional organic EL displays. FIG. 1A is a monolayer structure for an organic EL display. On a glass substrate 40, an anode 41 is formed. The anode 41 is a transparent ITO (indium tin oxide) electrode to transmit light therethrough. The ITO electrode is widely used in, for example, liquid crystal displays.

On the anode 41, an emission layer 42 is formed. The emission layer 42 is made of organic luminescent compounds. There are low-molecular organic materials and high-molecular organic materials. For the emission layer 42, a proper material is selected according to the characteristics of the material and the usage and manufacturing method of the organic EL display. On the emission layer 42, a cathode 43 is formed. According to the related art shown in FIG. 1A, light produced in the emission layer 42 is emitted from the glass substrate 40, and therefore, the cathode 43 is a metal electrode made of, for example, aluminum.

A power source 44 applies a DC voltage between the anode 41 and the cathode 43, so that the anode 41 injects holes into the emission layer 42 and the cathode 43 injects electrons into the emission layer 42. The injected holes and electrons recombine in the emission layer 42 to form an excited state that is an unstable high-energy state. Just after that, the holes and electrons quickly return to a ground state that is a stable low-energy state. At this time, the emission layer 42 discharges energy as light.

FIG. 1B shows a five-layer structure for an organic EL display. The five-layer structure of FIG. 1B has a glass substrate 45 on which an anode 46, a hole injection layer 47, a hole transport layer 48, an emission layer 49, an electron transport layer 50, an electron injection layer 51, and a cathode 52 are sequentially formed.

To easily take holes from the anode 46, the related art of FIG. 1B employs the hole injection layer 47 and the hole transport layer 48. The layer 48 transports holes from the hole injection layer 47 to the emission layer 49. To easily take electrons from the cathode 52, the related art employs the electron injection layer 51 and the electron transport layer 50. The layer 50 efficiently transports electrons from the electron injection layer 51 to the emission layer 49.

A power source 53 applies a DC voltage between the anode 46 and the cathode 52 so that holes from the anode 46 are passed through the hole injection layer 47 and hole transport layer 48 into the emission layer 49. At the same time, electrons from the cathode 52 are passed through the electron injection layer 51 and electron transport layer 50 into the emission layer 49. The injected holes and electrons recombine in the emission layer 49 to from an excited state that is an unstable high-energy state. Just after that, the holes and electrons quickly return to a ground state that is a stable low-energy state. At this time, the emission layer 49 discharges energy as light.

With these layers of different roles, the organic EL display efficiently emits light.

Layer structures are not limited to those shown in FIGS. 1A and 1B. There are other structures involving two to four layers. Depending on the characteristics of an emission layer and electrodes, the hole injection layer, hole transport layer, electron injection layer, and electron transport layer may be optionally selected and combined. Also, various organic materials are selectable for the organic EL display. Some organic materials provide both the functions of hole injection layer and hole transport layer.

As explained above, the organic EL display has the anode 41 (46) and cathode 43 (52) that sandwich the organic emission layer 42 (49) that emits light.

FIG. 2 is a sectional view showing an example of a pixel structure in an organic EL display according to a related art. On a glass substrate 54, a silicon oxide film 55 and a thin film transistor (TFT) 59 are formed. The silicon oxide film 55 functions to prevent metal ions from migrating from the glass substrate 54 to an anode 56. The TFT 59 is used to turn on and off the pixel. On the silicon oxide film 55, the anode 56 is formed. On the anode 56, an organic emission layer 57 is formed. The organic emission layer 57 is a combination of an emission layer, a hole injection layer, a hole transport layer, an electron injection layer, and an electron transport layer.

On the organic emission layer 57, a cathode 58 is formed. The cathode 58 is made of metal such as aluminum. This related art employs a bottom emission structure in which light produced in the organic emission layer 57 is emitted from the glass substrate 54 having the TFT 59.

To improve light emission efficiency, a top emission structure that emits light from the cathode 58 is also possible. In this case, the cathode 58 is made of transparent ITO.

To display an image on a display, many pixel driving methods have been developed. One popular method used to display a gradational image on an organic EL display provides each pixel with an analog memory and a voltage-current converter and controls a drive current to an organic EL element of the pixel according to a voltage of the analog memory. FIG. 3 shows an example of a display panel for displaying gradational images with the use of such a conventional driving method.

In FIG. 3, a pixel 67 (to be explained later in detail) has an organic EL element and an active element and is driven by display panel drivers. In the display panel, a plurality of pixels 67 are arranged in a two-dimensional matrix.

The display panel has a horizontal driver 68 to drive the pixels 67 in a horizontal direction. A power source circuit 69 supplies a source voltage to all of the pixels 67. A vertical driver 70 drives the pixels 67 in a vertical direction. To drive, for example, a top display line, a gate driver 65 (shown in FIG. 4) in the vertical driver 70 supplies a voltage to the top display line to turn on the pixels 67 in the top display line. At this time, gate drivers 65 in the vertical driver 70 for display lines other than the top display line supply a voltage to turn off the pixels 67 in the display lines other than the top display line.

At the same time, the horizontal driver 68 outputs voltages corresponding to an image signal for one scan line (display line), so that capacitors 62 of the pixels 67 in the top display line may receive data voltages. As a result, in the top display line, terminals of each capacitor 62 receive the source voltage and data voltage, respectively, and the capacitor 62 sufficiently accumulates charge to maintain the potential difference between the terminal voltages. Namely, the display data is written into the capacitors 62 in the top display line and is kept therein. Thereafter, the vertical driver 70 is turned off, and the organic EL elements 60 of the pixels 67 in the top display line emit light according to the data stored in the capacitors 62, to thereby display an image on one scan line. Thereafter, the vertical driver 70 sequentially drives the pixels 67 line by line from the top to the bottom of the display panel. In synchronization with this, the horizontal driver 68 outputs image data line by line, to thereby scan all pixels 67 in the display panel.

FIG. 4 is a circuit diagram showing one of the pixels 67. The organic EL element 60 corresponds to the organic emission layer 57 of FIG. 2. Data that determines the brightness of light emitted from the organic EL element 60 is provided through a data input terminal 64. The gate driver 65 applies a voltage to the gate of a TFT 61 to turn on the TFT 61, and data from the terminal 64 is transferred through the source and drain of the TFT 61 to the capacitor 62 and the gate of a TFT 63. The voltage of the data controls a current supplied through the source and drain of the TFT 63 to the organic EL element 60.

Thereafter, the TFT 61 is turned off, and a potential difference between a power source 66 and the data input terminal 64 is stored in the capacitor 62. The organic EL element 60 is a current-driven emission device, and therefore, the brightness of light emitted from the organic EL element 60 is proportional to a current applied thereto. Namely, the brightness of light emitted from the organic EL element 60 is dependent on the potential of data supplied through the terminal 64. According to the data, the gradation of an image to be displayed on the display is determined.

FIG. 2 showed a conventional layer structure of an organic EL display and FIG. 4 showed a circuit for driving such a display to display gradational images. There are other driving methods. For example, a clamped inverter method conducts analog modulation on emission periods in each frame according to a pulse width modulation (PWM) signal. (Refer to, for example, "An Innovative Pixel-Driving Scheme for 64-Level Gray Scale Full-Color Active Matrix OLED Displays," SID2002, 32.2.) This method compensates for threshold variations intrinsic to TFTs serving as active elements and reduces the number of TFTs to realize a simple circuit. This method employs no-emission periods to clearly display moving images.

There is a digital display driving method that turns on and off a switching transistor of each pixel, to control the ON/OFF state of an organic EL element of the pixel. An example of this method is disclosed in, for example, Japanese Unexamined Patent Application Publication No. Hei-10-214060. This disclosure divides an image into a plurality of subframes along a time axis and expresses a gradation level based on the total of weights of the subframes.

There is an area dividing method (for example, Japanese Unexamined Patent Application Publication No. Hei-11-073159) that divides a pixel into a plurality of sub-pixels in a screen of a display and expresses a gradation level based on the number of sub-pixels that emit light. There is another method (for example, Japanese Unexamined Patent Application Publication No. 2003-280593) employing sub-pixels. This method drives, in an analog mode, first sub-pixels to display a halftone image with multiple gradation levels, and at the same time, drives second sub-pixels to display a binary image with bright and dark levels.

The display driving method employing the circuit of FIG. 4 arranges the analog memory and voltage-current converter in each pixel, to express gradation. This method controls a current for driving an organic EL element according to a voltage of the analog memory. The characteristics of TFTs serving as active elements greatly vary from pixel to pixel, to vary a current passed to the organic emission layer. This results in varying the brightness of light from pixel to pixel, to cause brightness unevenness over the display and deteriorate the quality of displayed images.

An improvement of this method is the clamped inverter method disclosed in the above-mentioned "An Innovative Pixel-Driving Scheme for 64-Level Gray Scale Full-Color Active Matrix OLED Displays," SID2002, 32.2. This method is effective to eliminate variations among TFTs of a conventional display. This method employs an analog emission period modulation technique that only turns on and off TFTs and controls an emission period with an analog pulse width (PWM) to express a gradation level. Accordingly, this method can reduce the influence of TFT variations. This method, however, is disadvantageous in the length of service life of a display because a current necessary for an intended brightness level is entirely passed to one emission layer to increase load on the emission layer. In addition, the method has a flickering problem because each gradation level is achieved with emission and no-emission periods.

The digital driving method employing subframes disclosed in the Japanese Unexamined Patent Application Publication No. Hei-10-214060 drives a display in a binary mode to turn on and off an organic EL element in each pixel, to thereby eliminate brightness variations. To display a gradation level, this method divides a frame period into a plurality of subframe periods, scans all pixels in every subframe period, writes binary display data having a gradational bit configuration into each pixel, and turns on each pixel for a predetermined time at a predetermined brightness level corresponding to the intended gradation level. This digital driving method using subframes may eliminate the influence of the TFT variations. However, it has an interference problem of causing, for example, pseudo contours on moving images.

The area dividing methods disclosed in the Japanese Unexamined Patent Application Publications No. Hei-11-073159 and No. 2003-280593 necessitate a plurality of sub-pixels for every pixel, and therefore, are not suitable for the trend of high-resolution panels in the future.

SUMMARY OF THE INVENTION

The present invention has been made in consideration of the problems mentioned above. An object of the present invention is to provide a display capable of greatly reducing brightness variations among pixels on a screen of the display, accurately displaying gradational images, reducing a power loss, and realizing a long service life.

In order to accomplish the object, the present invention provides the following items.

(a) A display having an array of pixels each consisting of a plurality of color dots, the display comprising a light emitting element including "n" (n is a natural number equal to or greater than 2) emission layers (3, 6, 9) laid one over another to form one of the dots; a first driver (16a to 16c) configured to drive the n emission layers of the light emitting element so that the n emission layers individually emit light or no light; a power source (38) configured to pass a current through the first driver to the light emitting element; and a second driver (37, 39) configured to drive the n emission layers of the light emitting element so that the n emission layers emit light with their respective brightness weights to express a gradation level intended for the dot.

(b) In the display of (a), the second driver fixes one of a current passing period and current amount applied to the n emission layers and prepares "m" (m is a natural number equal to or smaller than n) kinds of values for the other, to thereby define m brightness weights.

(c) In the display of (a), the second driver sets "m" (m is a natural number equal to or smaller than n) combinations of a current passing period and a current value applied to the n emission layers, to thereby define m brightness weights.

(d) In the display of (b), the second driver changes the brightness weights assigned to the n emission layers frame by frame or field by field, so that the m kinds of values for the current passing period or current amount are repeated every n frames or every n fields.

(e) In the display of (c), the second driver changes the brightness weights assigned to the n emission layers frame by frame or field by field, so that the m combinations of a current passing period and a current value are repeated every n frames or every n fields.

(f) In the display of (a), the second driver has a digital driver for digitally driving "m" (m is a natural number equal to or smaller than n) of the n emission layers; and an analog driver for driving, in an analog mode, "n−m" of the emission layers so that the "n−m" emission layers may emit light of halftone levels.

(g) In the display of (f), the digital driver prepares m or lower kinds of values for brightness weight for the m emission layers; and the analog driver sets brightness weights for the "n−m" emission layers so that the m emission layers and the "n−m" emission layers collectively emit light that expresses the gradation level intended for the dot.

(h) A display having an array of pixels each consisting of a plurality of color dots, the display comprising a light emitting element having "n" (n is a natural number equal to or greater than 2) unit elements laid one over another to form one of the dots, each of the unit elements having an anode (402), a multiphoton emission part, and a cathode (410) that are sequentially laid one over another, the multiphoton emission part having "m" (m is a natural number) organic emission layers (403, 405, 407, 409) and "m−1" charge generation layers (404, 406, 408) that are alternately laid one over another; a first driver (458) configured to drive the multiphoton emission parts so that the multiphoton emission parts individually emit light or no light; and a second driver (457, 459) configured to drive then multiphoton emission parts of the light emitting element so that the n multiphoton emission parts emit light with their respective brightness weights to express a gradation level intended for the dot.

(i) In the display of (h), the charge generation layer held between adjacent two of the organic emission layers injects electrons into one of the two organic emission layers and holes into the other.

The display according to the present invention can greatly reduce pixel brightness unevenness over a screen of the display, precisely display gradation levels, minimize a power loss, and elongate a service life.

The display of the present invention digitally drives the light emitting element of a dot to express a gradation level intended for the dot according to the sum of brightness weights. Namely, without the influence of variations in the threshold values of the first driver, the display can drive each light emitting element, to thereby eliminate brightness unevenness over the screen of the display and reduce a power loss.

According to the present invention, a current necessary for realizing an intended brightness level is not entirely passed to a single emission layer. Namely, the present invention distributes the current to a plurality of emission layers. This results in extending the service life of the display of the present invention compared with the related arts.

The present invention expresses a gradation level of a dot with the sum of brightness of n emission layers. This results in extending the service life of the display of the present invention compared with the conventional display that passes a current necessary for realizing a required brightness level to a single emission layer.

The nature, principle and utility of the invention will become more apparent from the following detailed description when read in conjunction with the accompanying drawings.

BRIEF DESCRIPTION OF THE DRAWINGS

In the accompanying drawings:

FIG. 5 is a view showing a layer structure of a pixel in a display according to a first embodiment of the present invention;

FIG. 6 is a view showing a pixel structure according to the first embodiment;

FIGS. 7A and 7B are views showing examples of brightness weights on organic emission layers in three- and five-layer structures;

FIG. 8 is a view showing an example of a gradation expressing method for a display according to the present invention;

FIGS. 14A to 14C are tables explaining a gradation expressing method for each frame in the display according to the second embodiment;

DETAILED DESCRIPTION OF EMBODIMENTS

First Embodiment

Figure 1B:
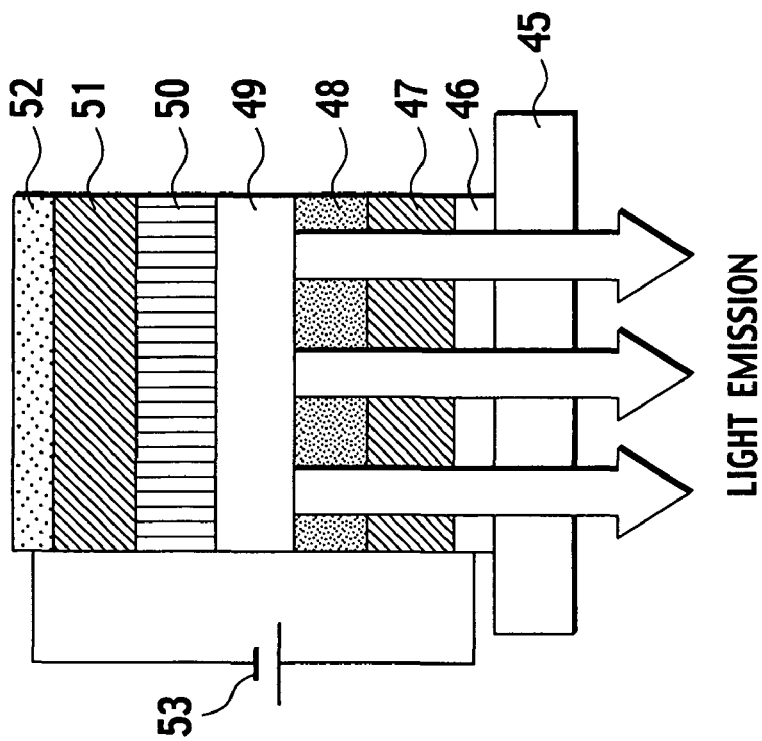
FIGS. 1A and 1B are views showing a basic layer structure and a five-layer structure of organic EL displays.
Figure 1A:
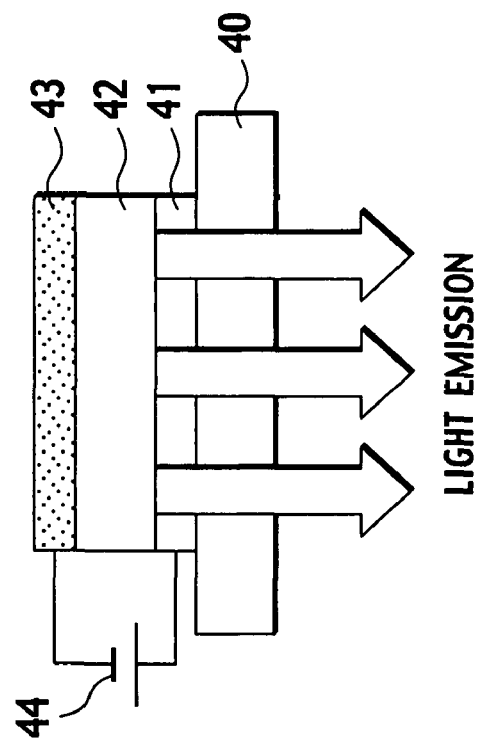
Figure 2:
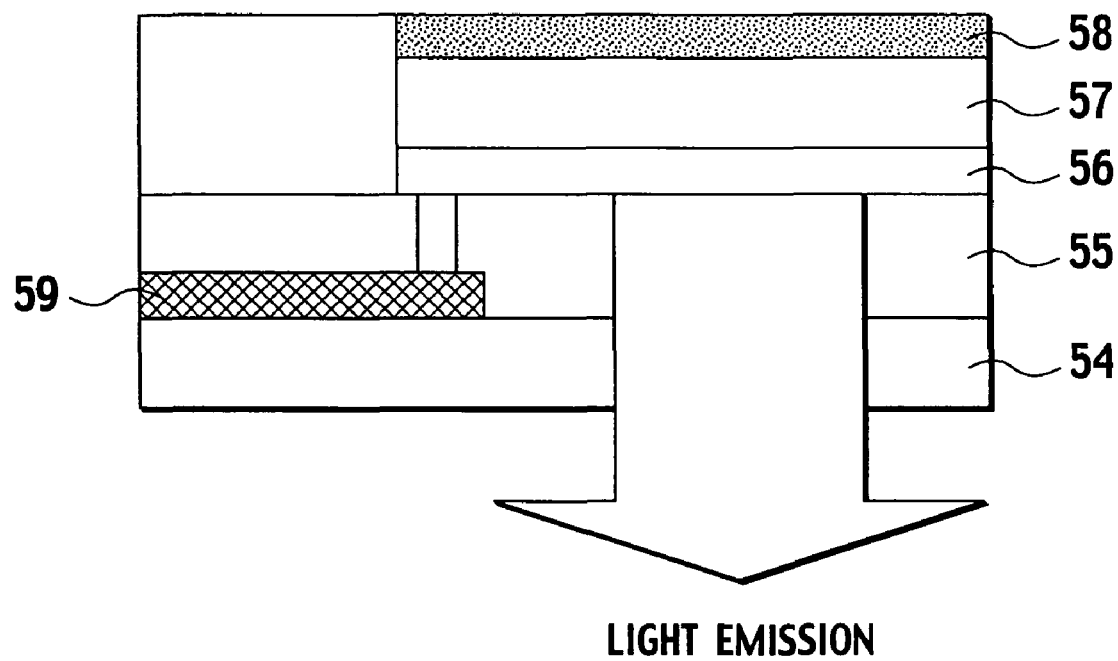
FIG. 2 is a sectional view showing an example of a pixel structure of a display according to a related art.
Figure 3:
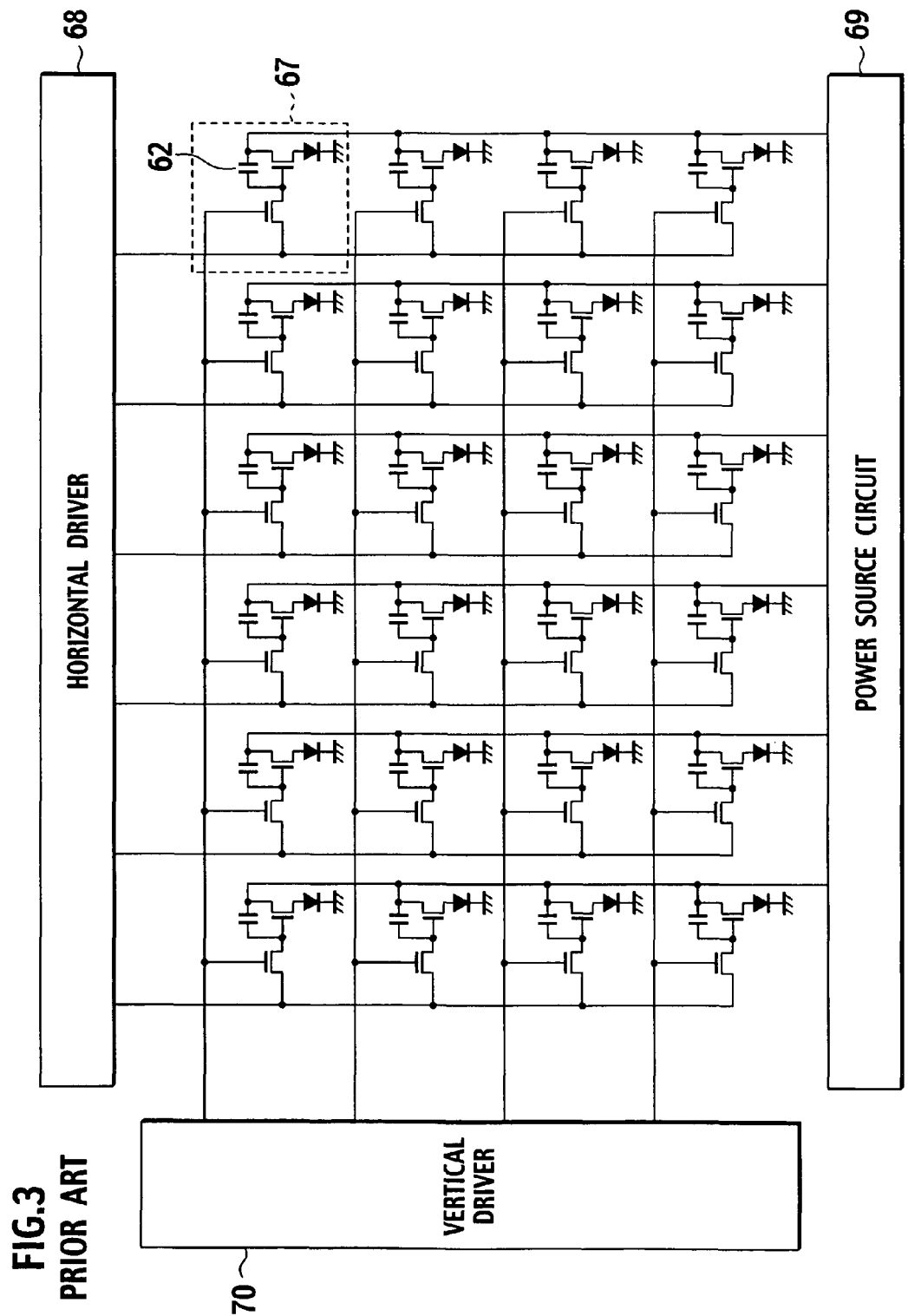
FIG. 3 is a view showing an example of a structure for driving a display panel of a display according to a related art.
Figure 4:
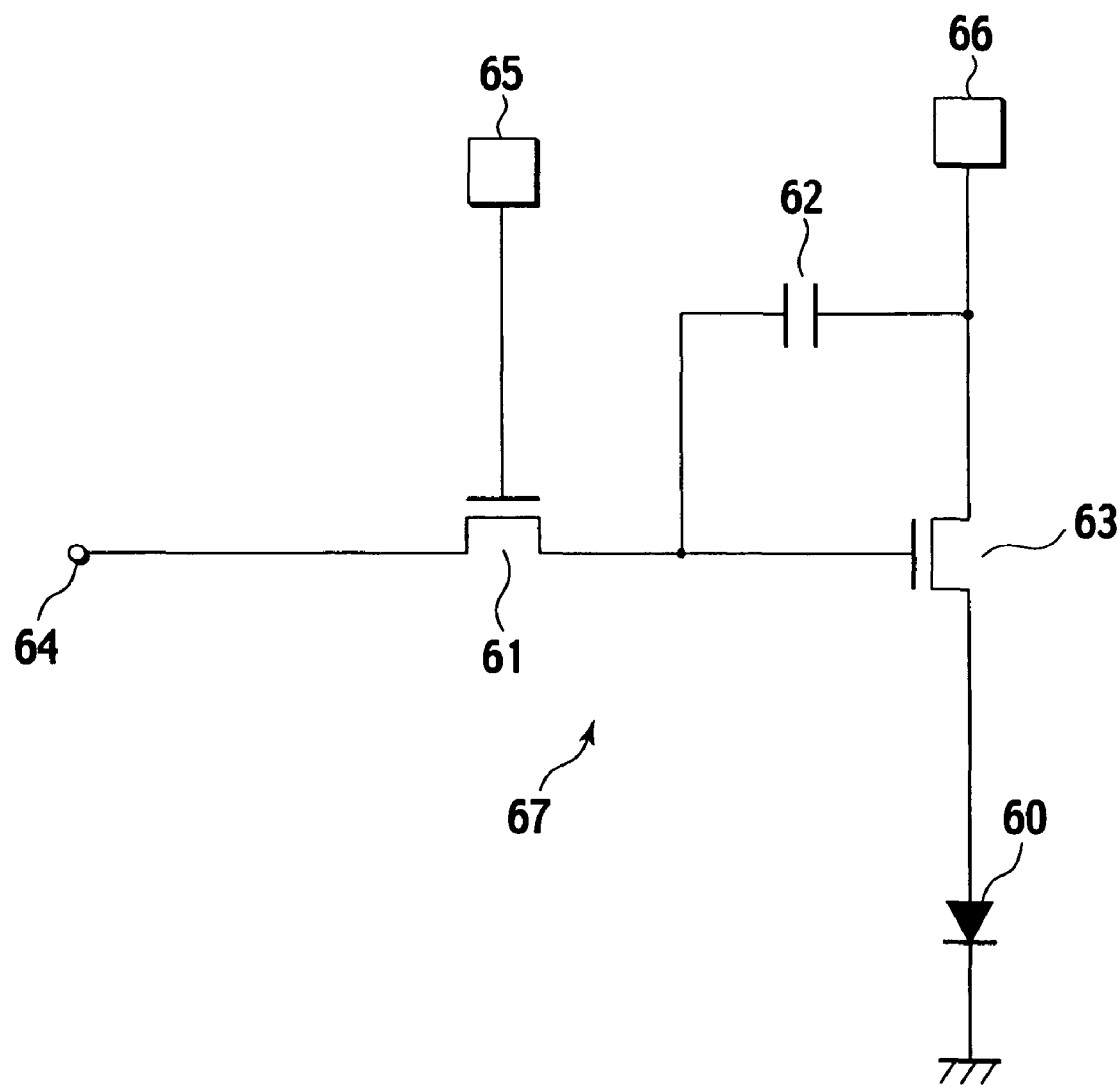
FIG. 4 is a view showing an example of a drive circuit of a display according to a related art.

FIG. 5 shows a layer structure of a pixel in a display according to a first embodiment of the present invention. This display is, for example, an organic EL display. A glass substrate 1 is a screen of the display. The glass substrate 1 may be made of, for example, plastic material if it is useful to form organic film layers thereon. On the glass substrate 1, an anode 2 is formed. The anode 2 is, for example, a transparent ITO electrode.

On the anode 2, an organic emission layer 3 is formed. The organic emission layer 3 is a combination of a hole injection layer, a hole transport layer, an electron injection layer, an electron transport layer, and an emission layer made of organic luminescent compounds. The combination must be properly selected according to organic EL characteristics.

On the organic emission layer 3, a cathode 4 is formed. If the cathode 4 is a transparent ITO electrode, it will not operate as a cathode if used as it is. It is necessary to insert, for example, a thin lithium cathode between the ITO electrode and the organic emission layer 3.

A power source 13 is connected to apply a DC voltage between the anode 2 and the cathode 4. A light emitting principle of the organic emission layer 3 held between the anode 2 and the cathode 4 is the same as that of the related art.

On the cathode 4, a silicon oxide film 11 and an anode 5 are sequentially laid one over another. The silicon oxide film 11 has an effect of insulating the cathode 4 from the anode 5.

On the anode 5, an organic emission layer 6, a cathode 7, a silicon oxide film 12, an anode 8, an organic emission layer 9, and a cathode 10 are sequentially formed like those mentioned above. The first embodiment employs a bottom emission structure that emits no light from the cathode 10. Accordingly, the cathode 10 is made of metal such as aluminum.

A power source 14 is connected to apply a DC voltage between the anode 5 and the cathode 7, and a power source 15 is connected to apply a DC voltage between the anode 8 and the cathode 10. As a result, the organic emission layers 6 and 9 receive DC-voltage-converted currents from the power sources 14 and 15 through the anodes 5 and 8 and cathodes 7 and 10.

The organic emission layers 3, 6, and 9 emit light at brightness levels proportional to the converted current values, respectively, and the light is emitted from the glass substrate 1. This structure is naturally applicable not only to organic EL displays but also to inorganic EL displays. Also, it is applicable not only to active driving displays but also to passive driving displays.

The organic emission layers 3, 6, and 9 are switched between on and off (light emission and no light emission) states according to two values, i.e., on and off values of the respective power sources. Each of the organic emission layers 3, 6, and 9 is formed from a material selected to emit light at a predetermined brightness.

FIG. 6 shows a pixel structure of the display according to the first embodiment of the present invention. In FIG. 6, the same parts as those shown in FIG. 5 are represented with the same reference marks and their explanations are omitted. FIG. 6 shows one of color dots (for example, red, green, and blue dots) that form a pixel. On the glass substrate 1, thin film transistors (TFTs) 16a, 16b, and 16c serving as active elements are formed and are connected to the anodes 2, 5, and 8, respectively. The TFTs 16a to 16c may be any active elements made of p-Si (low-temperature polysilicon), a-Si (amorphous silicon), or the like if they can drive and control the organic emission layers 3, 6, and 9.

The TFTs 16a to 16c function to turn on and off power applied from the power sources to the organic emission layers 3, 6, and 9, respectively. Turning on and off the power sources drives the organic emission layers 3, 6, and 9 so that they emit light or no light. A silicon oxide film 17 formed between the glass substrate 1 and the anode 2 prevents metal ions from migrating from the glass substrate 1 to the anode 2. The cathodes 4, 7, and 10 form a common electrode.

To emit light from the glass substrate 1 that is at the bottom of the pixel shown in FIG. 6, the cathode 10 at the top of the pixel must not leak light. To achieve this, the cathode 10 is made of metal such as aluminum. Light emitted from the organic emission layers 3, 6, and 9 advances in upward and downward directions. The light advanced toward the cathode 10 is reflected with the cathode 10 and is oriented toward the bottom. Consequently, light is emitted only from the glass substrate 1.

According to the first embodiment, the glass substrate 1 is provided with the TFTs 16a to 16c, and the bottom emission structure emits light from the glass substrate 1. It is possible to make the cathode 10 from a transparent material and the anode 2 from metal such as aluminum, to thereby form a top emission structure that emits light from the cathode 10.

A plurality of the TFTs 16a to 16c are usually needed. The TFTs 16a to 16c are collectively referred to as an element driver (first driver). Each organic emission layer and a corresponding element driver form a unit element. The organic EL display shown in FIG. 6 has three emission layers in a vertical direction on the screen of the display. Namely, the display has three-layer light emitting elements.

FIG. 7A shows brightness weights assigned to the three organic emission layers 3, 6, and 9 of each pixel shown in FIGS. 5 and 6. A brightness weight is a numerical value relative to a reference value and corresponds to the brightness of light emitted from an organic emission layer. In the following explanation, the organic emission layers 3, 6, and 9 are referred to as first, second, and third layers, respectively. The materials and configurations of the organic emission layers 3, 6, and 9 are selected so that the first layer may have a brightness value (brightness weight) of 1, the second layer a brightness value of 2, and the third layer a brightness value of 4.

The brightness of a given organic emission layer is the brightness of light emitted from the layer when the corresponding source voltage is ON. The organic emission layers 3, 6, and 9 are digitally driven by turning on and off their source voltages.

FIG. 7B is an example of brightness weights of five organic emission layers in a display having a five-layer structure. The five-layer structure has additional two unit elements in addition to the structure shown in FIGS. 5 and 6. From a light emitting side, the five organic emission layers are referred to as first, second, third, fourth, and fifth layers, respectively. These layers are set such that, when the first layer has a brightness value (brightness weight) of 1, the second layer has a brightness value of 2, the third layer a brightness value of 4, the fourth layer a brightness value of 8, and the fifth layer a brightness value of 16.

The brightness weight of an organic emission layer is preferably based on the "n"th power of 2 as shown in FIGS. 7A and 7B because it can reduce the number of the organic emission layers. The present invention, however, is not limited to this. It is not always necessary that the brightness weights of organic emission layers are in an ascending order from the light emitting side. They may be in a descending order or in an optional order. The brightness weighting method mentioned above is applicable not only to active driving displays but also to passive driving displays.

FIG. 8 shows an example of expressing the gradation of a pixel in the display according to the first embodiment of the present invention. This example expresses a gradation level by weighting the brightness of a pixel that employs three organic emission layers as shown in FIG. 7A. The three organic emission layers can express gradation levels of the third power of 2, i.e., eight gradation levels. In FIG. 8, horizontal columns show the locations of the organic emission layers and vertical columns show gradation levels displayed on the display. A black dot indicates that the organic emission layer in question is turned on to emit light, and any organic emission layer without the black dot is turned off to emit no light.

A gradation level of 0 is achieved with the first, second, and third layers being turned off to emit no light. Namely, the gradation level of 0 displays black. A gradation level of 1 is achieved with only the first layer turned on. The brightness weight of the first layer is 1 to provide the gradation level of 1. A gradation level of 2 is achieved with only the second layer turned on. The brightness weight of the second layer is 2 to provide the gradation level of 2. A gradation level of 3 is achieved with the first and second layers turned on. The brightness weights of the first and second layers are 1 and 2, respectively, and the total weight of 3 provides the gradation level of 3. A gradation level of 4 is achieved with only the third layer turned on. The brightness weight of the third layer is 4 to provide the gradation level of 4.

A gradation level of 5 is achieved with the first and third layers turned on. The brightness weights of the first and third layers are 1 and 4, respectively, and the total weight of 5 provides the gradation level of 5. A gradation level of 6 is achieved with the second and third layers turned on. The brightness weights of the second and third layers are 2 and 4, respectively, and the total weight of 6 provides the gradation level of 6. A gradation level of 7 is achieved with all of the first, second, and third layers turned on. The brightness weights of the first, second, and third layers are 1, 2, and 4, respectively, and the total thereof is 7 to provide the gradation level of 7.

Figure 9:
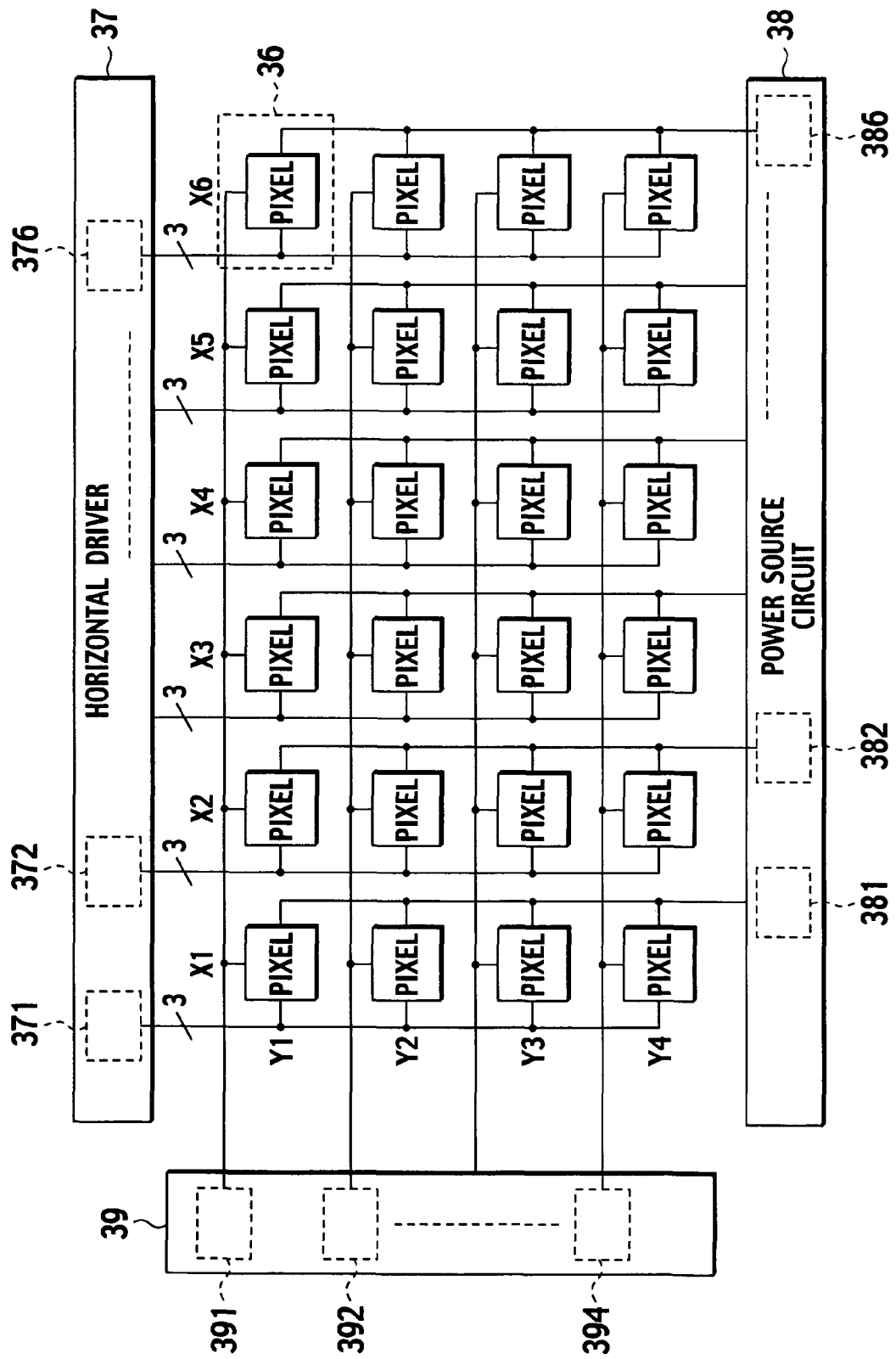
FIG. 9 is a view showing a structure for driving a display panel according to the first embodiment.

FIG. 9 is a view showing a structure for driving a display panel of the display according to the first embodiment of the present invention. In FIG. 9, each pixel 36 corresponds to a pixel circuit to be explained later with reference to FIG. 10. The display panel includes a plurality of pixels 36 that are arranged in a two-dimensional matrix. A horizontal driver 37 supplies data to the pixels 36. A power source circuit 38 drives the pixels 36. A vertical driver 39 sequentially selects lines in a vertical direction. The horizontal driver 37 and vertical driver 39 collectively serve as a second driver.

The pixels 36 are in rows Y that are arranged in a vertical direction and in columns X that are arranged in a horizontal direction. The rows Y and columns X form the two-dimensional matrix. According to the example of FIG. 9, the display panel includes four rows Y1 to Y4 and six columns X1 to X6. Although an actual display panel includes more rows and columns, the display panel of FIG. 9 has smaller numbers of rows and columns for the convenience of explanation.

According to the first embodiment, the horizontal driver 37 includes data drivers 371 to 376, the power source circuit 38 includes power source units 381 to 386, and the vertical driver 39 includes gate drivers 391 to 394.

To scan the top row Y1 of the display panel in FIG. 9, the gate driver 391 of the vertical driver 39 turns on each pixel 36 in the row Y1. At the same time, the gate drivers 392 to 394 turn off the other rows Y2 to Y4. At this time, the horizontal driver 37 supplies image data for one line to the pixels 36 in the row Y1.

Thereafter, the gate driver 391 turns off the pixels 36 in the row Y1, to display an image on the row Y1. In this way, the vertical driver 39 sequentially drives the gate driver 392 for the row Y2 to the gate driver 394 for the row Y4, and the horizontal driver 37 outputs image data row by row, to scan all pixels 36 in the display panel.

Figure 10:
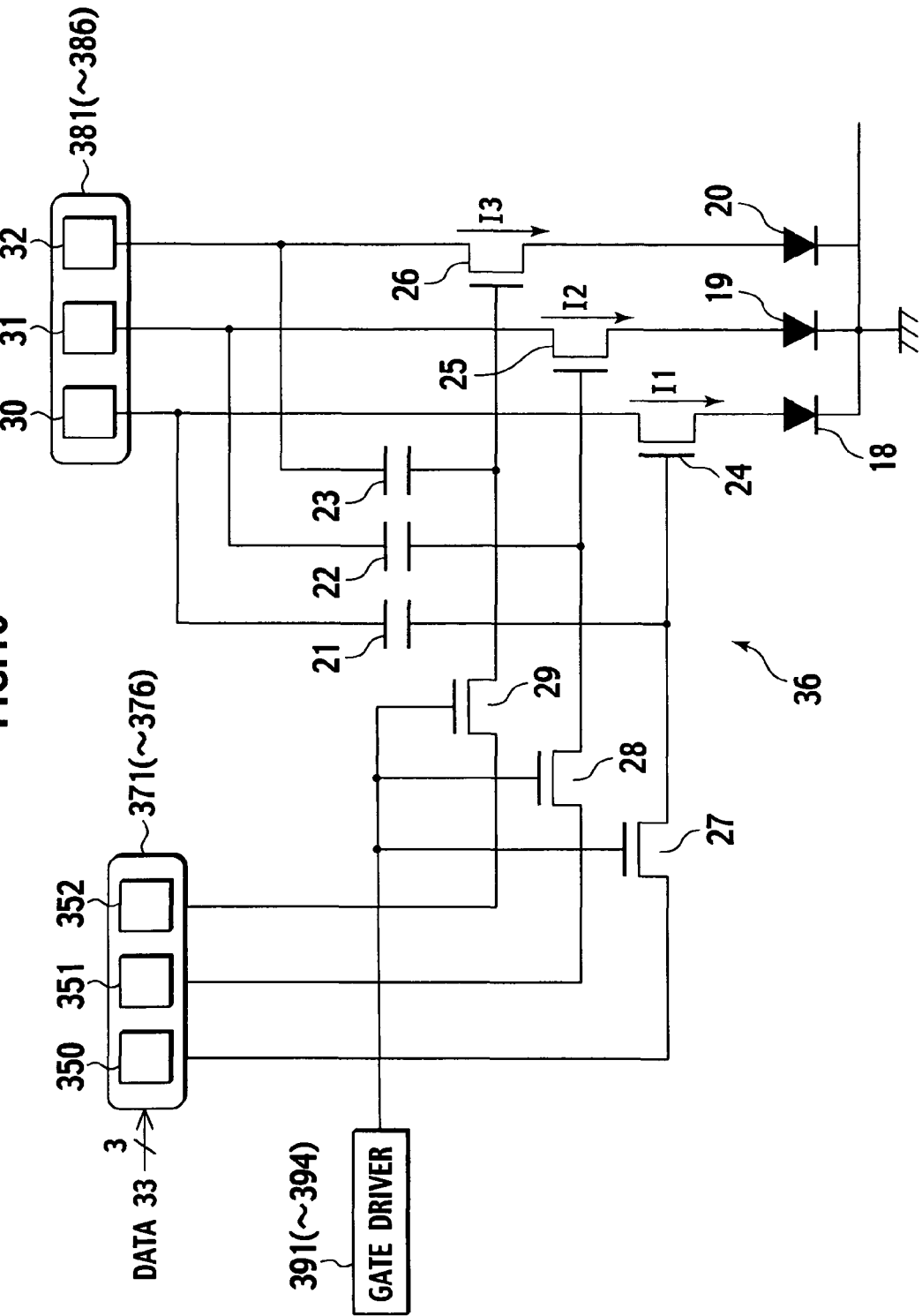
FIG. 10 is a view showing a circuit for driving a pixel according to the first embodiment.

FIG. 10 is a circuit diagram showing a circuit for driving a pixel in the display according to the first embodiment. In FIG. 10, organic EL emission layers 18, 19, and 20 correspond to the organic emission layers 3, 6, and 9 of FIGS. 5 and 6, respectively.

According to the first embodiment, the organic EL emission layers 18, 19, and 20 (organic emission layers 3, 6, and 9) of a pixel 36 are made of materials that emit light of different brightness levels, to realize the weights shown in FIG. 7A. Accordingly, the same quantity of current is passed for the same period to the organic EL emission layers 18, 19, and 20.

One ends (anodes in FIG. 10) of the organic EL emission layers 18 to 20 are connected through the sources and drains of driving TFTs 24 to 26 to power sources 30 to 32 that form a power source unit 381. The gates of the TFTs 24 to 26 are connected to the sources of TFTs 27 to 29, respectively. The TFTs 27 to 29 serve as gate transistors. The gates of the TFTs 24 to 26 are also connected through capacitors 21 to 23 to the power sources 30 to 32, respectively.

The power sources 30, 31, and 32 of the power source unit 381 correspond to the power sources 13, 14, and 15 shown in FIG. 5. The power sources 30 to 32 may be discrete power sources or may form a common power source. The power sources 30 to 32 are set to make the organic EL emission layers 18 to 20 emit light at the respective weights and respective brightness levels. The drains of the TFTs 27 to 29 are connected to data holders 350 to 352 in a data driver 371, and the gates of the TFTs 27 to 29 are commonly connected to a gate driver 391.

The structures of the data driver 371, power source unit 381, and gate driver 391 shown in FIG. 10 are also applicable to data drivers 372 to 376, power source units 382 to 386, and gate drivers 392 to 394 as indicated in FIG. 10. The data drivers 371 to 376, power source units 381 to 386, and gate drivers 391 to 394 drive the pixels 36 in the rows Y and columns X of the display panel.

Operation of the drive circuit of FIG. 10 will be explained. First, data 33 (three bits) with a predetermined gradation level to be displayed on the pixel 36 is supplied to the data driver 371. The data 33 is preferably digital serial data or parallel data. The data 33 supplied to the data driver 371 is used to turn on those of the organic EL emission layers 18, 19, and 20 corresponding to the gradation level to be displayed.

The bits (each being 1 or 0) of the data 33 are stored in the data holders 350 to 352, respectively. The gate driver 391 applies a first potential to the gates of the gate transistors 27 to 29, thereby turning on the gate transistors 27 to 29. The data driver 371 outputs the data, which is transferred through the drains and sources of the gate transistors 27 to 29 to the capacitors 21 to 23. As a result, the ends of the capacitors 21 to 23 receive source voltages and the data voltages, and the capacitors 21 to 23 accumulate charges to sufficiently hold the potential differences between the voltages applied to the ends thereof. Namely, the display data from the data driver 371 is written into the capacitors 21 to 23, which keep the data. Thereafter, the gate driver 391 applies a second potential to the gates of the gate transistors 27 to 29, to turn off the gate transistors 27 to 29. Once the gate transistors 27 to 29 are turned off, the capacitors 21 to 23 hold the accumulated charges. The charges held in the capacitors 21 to 23 correspond to the potential differences between the voltages of the power sources 30 to 32 and the output voltages of the data driver 371.

Displaying an image with a gradation level of, for example, 5 on the display will be explained. According to FIG. 8, the gradation level of 5 is achievable by turning on the first and third organic EL emission layers 18 and 20. The input data 33 is converted by the data driver 371 into a data string connected to signal lines of the corresponding organic EL emission layers. In this example, the data holders 350 and 352 hold data to make the organic EL emission layers 18 and 20 emit light.

At this time, the capacitor 21 receives a voltage to turn on the TFT 24, and the capacitor 23 receives a voltage to turn on the TFT 26. As a result, the TFTs 24 and 26 are turned on. On the other hand, the capacitor 22 receives no voltage for driving the TFT 25, and therefore, the TFT 25 is in an OFF state.

Since the TFTs 24 and 26 are ON, currents from the power sources 30 and 32 are passed through the drains and sources of the TFTs 24 and 26 to the organic EL emission layers 18 and 20, which thus emit light. At this time, the organic EL emission layers 18 and 20 have the brightness weights of 1 and 4, respectively, and therefore, the total gradation level of 5 is displayed on the display.

According to the pixel driving technique of the first embodiment, the driving TFTs 24 to 26 are only turned on and off. Accordingly, the circuit configuration of the first embodiment is simple as shown in FIG. 10 with the capacitors 21 to 23 for storing data being used to turn on and off the driving TFTs 24 to 26 and the gate transistors 27 to 29 being used to make the capacitors hold the data.

The driving TFTs 24 to 26 according to the first embodiment are only turned on and off. Namely, these transistors are operated in a saturation region. Due to this, the first embodiment is free from the problem of threshold variations in active TFTs of the related art. As a result, the first embodiment can minimize brightness unevenness and gradation deviation over a display panel. Operating TFTs in the saturation region reduces a power loss of the TFTs, thereby reducing power consumption.

According to the first embodiment, a current supplied to each pixel is distributed to a plurality of emission layers. It is said that the service life of an organic EL emission layer is inverse proportion to the square of a current value. Distributing a current to a plurality of emission layers reduces a current quantity to each emission layer, to thereby extend the service life of the display compared with a display employing a conventional circuit configuration.

Second Embodiment

A pixel in a display according to a second embodiment of the present invention will be explained in detail. The first embodiment mentioned above forms the organic emission layers from different materials so that the layers may emit light of different brightness levels, i.e., may provide different brightness weights. The second embodiment forms organic emission layers from the same material and applies different current values to the layers for different periods, so that the layers may emit light of predetermined brightness levels. The second embodiment will be explained in detail with reference to first to seventh examples of brightness weighting techniques.

The layer-structure and configuration of a pixel according to the second embodiment are the same as those of the first embodiment, and therefore, the explanation thereof will be omitted. The brightness weight of each layer of the second embodiment is based on FIG. 7A, and the gradation level expression of the second embodiment is based on FIG. 8.

Figure 11:
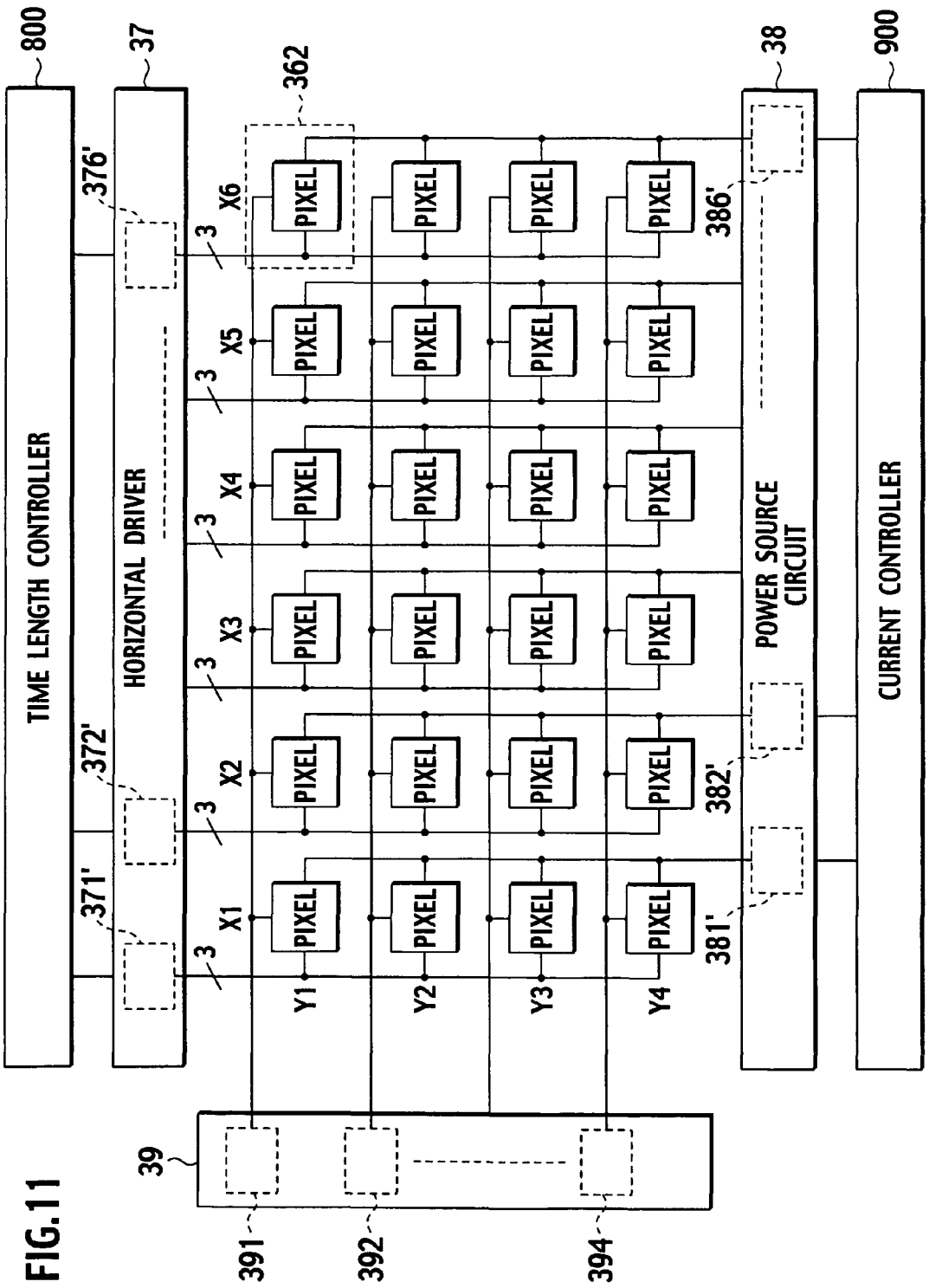
FIG. 11 is a view showing a structure for driving a display panel according to a second embodiment of the present invention.

FIG. 11 is a view showing a structure for driving a display panel of the display according to the second embodiment. In FIG. 11, each pixel 362 corresponds to a pixel circuit to be explained later with reference to FIG. 12. In FIG. 11, the same parts as those of FIG. 9 are represented with the same reference marks and the explanation thereof is omitted. The display panel according to the second embodiment has a time length controller 800, data drivers 371' to 376' arranged in a horizontal driver 37, a current controller 900, and power sources 381' to 386' arranged in a power source circuit 38.

Figure 12:
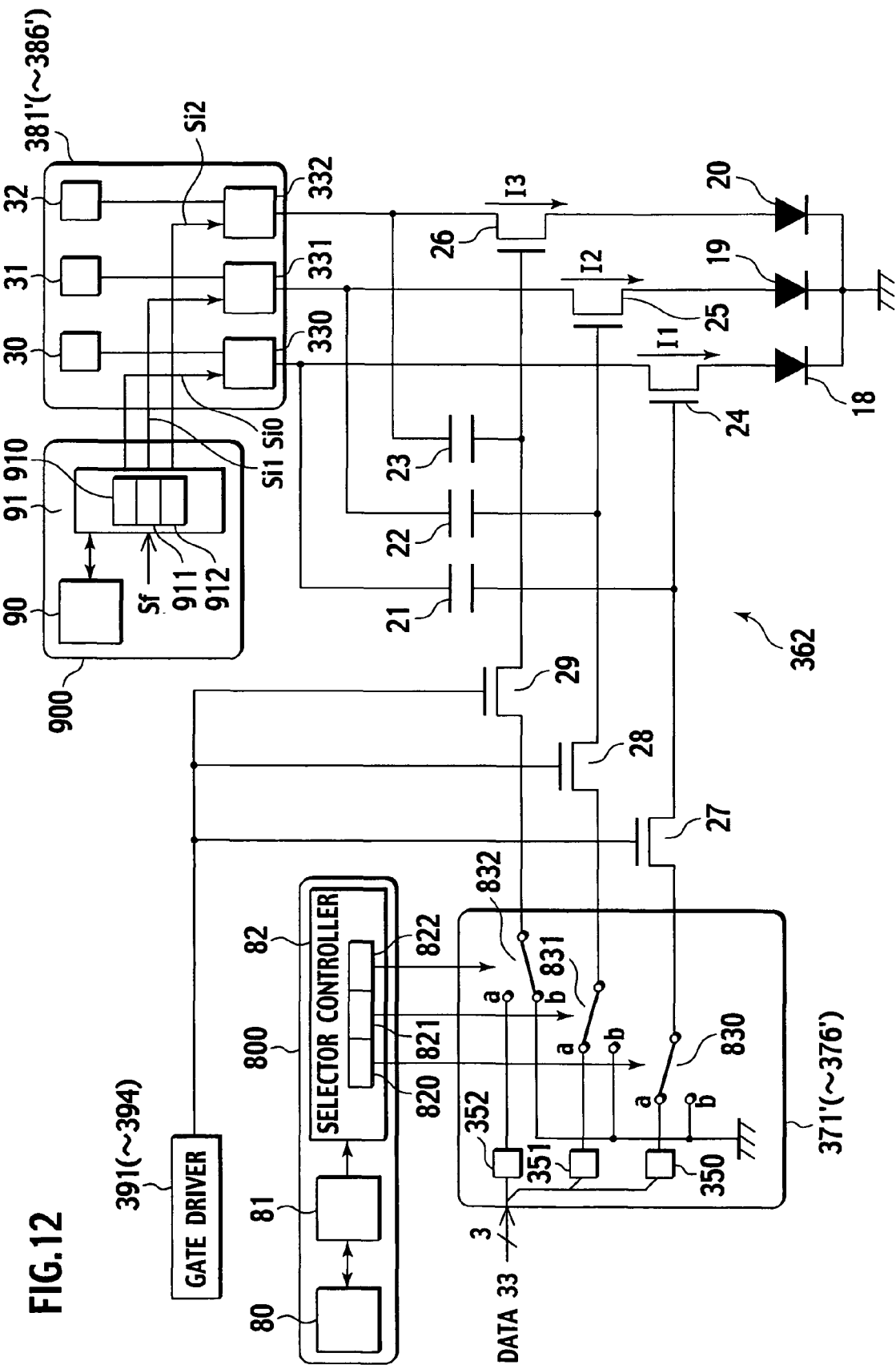
FIG. 12 is a view showing a circuit for driving a pixel according to the second embodiment.

FIG. 12 shows a circuit for driving a pixel 362 according to the second embodiment. In FIG. 12, the same parts as those of FIG. 10 are represented with the same reference marks and the explanation thereof is omitted.

Components in the time length controller 800 will be explained. A time length table holder 80 holds a time length table. A time length control signal generator 81 generates a time length control signal according to time length data read out of the time length table and outputs the signal to a selector controller 82. The selector controller 82 has switching signal generators 820 to 822 that switch terminals a and b of selectors 830 to 832 arranged in the data driver 371'. The terminals a of the selectors 830 to 832 receive bits that form data 33, respectively, and the terminals b thereof are grounded to receive 0. In front of the terminals a, the data driver 371' has data holders 350 to 352 corresponding to the data holders of FIG. 10.

Figure 13:
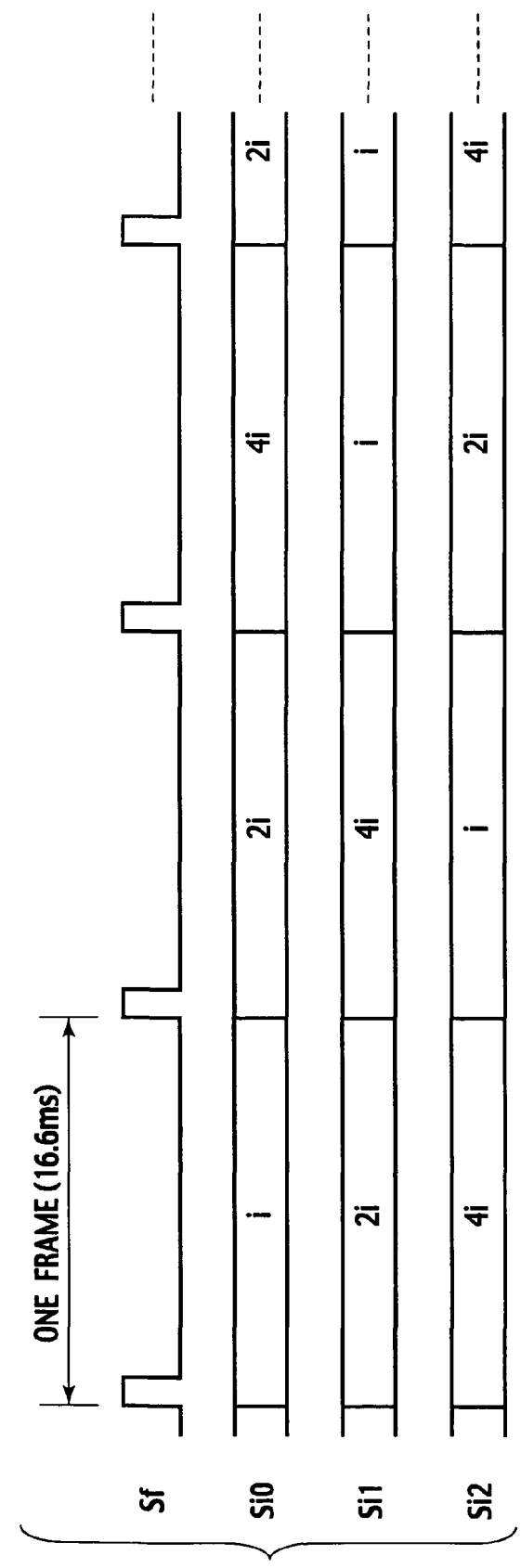
FIG. 13 is a view showing a relationship between a frame signal and current value switching signals.

Components in the current controller 900 will be explained. A current value table holder 90 holds a current value table. A current control signal generator 91 reads current value data from the current value table. According to the read data, current value switching signal generators 910 to 912 in the current control signal generator 91 output current value switching signals Si0 to Si2. The current switching signal generator 91 receives a frame signal Sf including a frame synchronizing pulse that becomes high at the start of each frame. As shown in FIG. 13, the current value switching signals Si0 to Si2 are changed in synchronization with the frame signal Sf. The current value switching signal generators 910 to 912 are connected to variable units 330 to 332 arranged in the power source unit 381'. According to the current value switching signals Si0 to Si2, the variable units 330 to 332 change current values. The variable units 330 to 332 change currents supplied from power sources 30 to 32 and supply the changed currents of predetermined values to the organic EL emission layers 18 to 20.

In this example, the time length table holder 80 is arranged in the time length controller 800 and the current value table holder 90 is arranged in the current controller 900. This configuration does not limit the present invention. For example, the time length table holder 80 and current value table holder 90 may be arranged in the same storage unit.

The structures of the data driver 371', power source unit 381', and gate driver 391 mentioned above are applicable to data drivers 372' to 376', power source units 382' to 386', and gate drivers 392 to 394. The data drivers 371' to 376', power source units 381' to 386', and gate drivers 391 to 394 drive the pixels 362 arranged in rows Y and columns X in the display panel.

In each of the examples mentioned below, an assumption is made that the brightness levels of light emitted from the organic EL emission layers 18 to 20 have brightness weights 1, 2, and 4, respectively. Unless otherwise specified, "weighting" refers to providing such brightness weights. To make the organic EL emission layer 18 emit light having the brightness weight of 1, the power source 30 supplies a current I1 to a TFT 24 that is turned on for a period of T1. To make the organic EL emission layer 19 emit light having the brightness weight of 2, the power source 31 supplies a current I2 to a TFT 25 that is turned on for a period of T2. To make the organic EL emission layer 20 emit light having the brightness weight of 4, the power source 32 supplies a current I3 to a TFT 26 that is turned on for a period of T3.

(First Example of Weighting)

Weighting brightness by passing different current values to the organic EL emission layers 18, 19, and 20, respectively, will be explained. The TFTs 24 to 26 are turned on for T1=T2=T3=t.

The value of the current I1 passed to the organic EL emission layer 18 is i, that of the current I2 to the layer 19 is 2i, and that of the current I3 to the layer 20 is 4i. These current values are supplied from the current controller 900 and the power source unit 381' in the power source circuit 38.

Products obtained by multiplying the current values passed to the organic EL emission layers 18 to 20 by the period t determine the brightness weights of the layers 18 to 20.

(Second Example of Weighting)

Weighting brightness by passing currents of the same current value for different periods to the organic EL emission layers 18 to 20 will be explained. The same current value of I1=I2=I3=i is passed to the layers 18 to 20.

The organic EL emission layer 18 is turned on for a period T1 having a time length of t, the layer 19 is turned on for a period of T2 having a time length of 2t, and the layer 20 is turned on for a period of T3 having a time length of 4t. The time length data is set in the time length controller 800.

To weight the brightness of light emitted from the organic EL emission layers 18 to 20, the first example mentioned above passes different current values for the same period and the second example passes the same current value for different time lengths. These examples do not limit the present invention. Other techniques like the following third and fourth examples that combine the above-mentioned two examples are also possible.

(Third Example of Weighting)

This example differs current values as well as time lengths. The organic EL emission layer 18 receives a current I1 of a current value of i for an ON time T1 of a time length of t. The layer 19 receives a current I2 of a current value of (3/2)i for an ON time T2 of a time length of (4/3)t. The layer 20 receives a current I3 of a current value of 2i for an ON time T3 of a time length of 2t.

(Fourth Example of Weighting)

An other example of combining the above-mentioned first and second examples will be explained. This example partly differs current values and time lengths applied to the organic EL emission layers 18 to 20. For example, the organic EL emission layer 18 receives a current I1 of a current value of i for an ON time T1 of a time length of t, the layer 19 receives a current I2 of a current value of i for an ON time T2 of a time length of 2t, and the layer 20 receives a current I3 of a current value of 2i for an ON time T3 of a time length of 2t.

The first to fourth examples may be further modified to differ current values and emission time lengths among the emission layers 18 to 20, and at the same time, equalize current values and emission time lengths among the emission layers 18 to 20 when averaged for a given period.

FIGS. 14A, 14B, and 14C are tables explaining techniques for expressing gradation levels in each frame (or each field in the case of an interlace driving method). These tables show current values and current applying periods that are changed frame by frame and are applied to the first to third organic EL emission layers 18 to 20. A total brightness provided when all of the emission layers emit light is unchanged through the frames.

(Fifth Example of Weighting)

FIG. 14A shows a table according to a fifth example of brightness weighting that passes different current values for providing brightness weights to the organic EL emission layers, respectively, and changes the current values frame by frame. The time length t is the same for the layers. According to the table shown in FIG. 14A, the first layer receives a current value of i, the second layer a current value of 2i, and the third layer a current value of 4i in the first frame. In the second frame, the first layer receives a current value of 2i, the second layer a current value of 4i, and the third layer a current value of i. In the third frame, the first layer receives a current value of 4i, the second layer a current value of i, and the third layer of a current value of 2i. In this way, current values supplied to the organic EL emission layers are changed frame by frame. Namely, brightness weights assigned to the organic EL emission layers are changed from frame to frame. According to the fifth example, the fourth frame and frames that follow repeat the current values set for the first to third frames.

Namely, current values applied to the layers are repeated every three frames. For this, the fifth example prepares three kinds of values for weighting brightness.

If all organic EL emission layers emit light in every frame, every layer provides the same total brightness when totaled every three frames. This setting averages a total current value passed to each organic EL emission layer and equalizes the service lives of the organic EL emission layers.

As explained above, the fifth example changes current values applied to the organic EL emission layers according to the table shown in FIG. 14A stored in the current value table holder 90.

Figure 15:
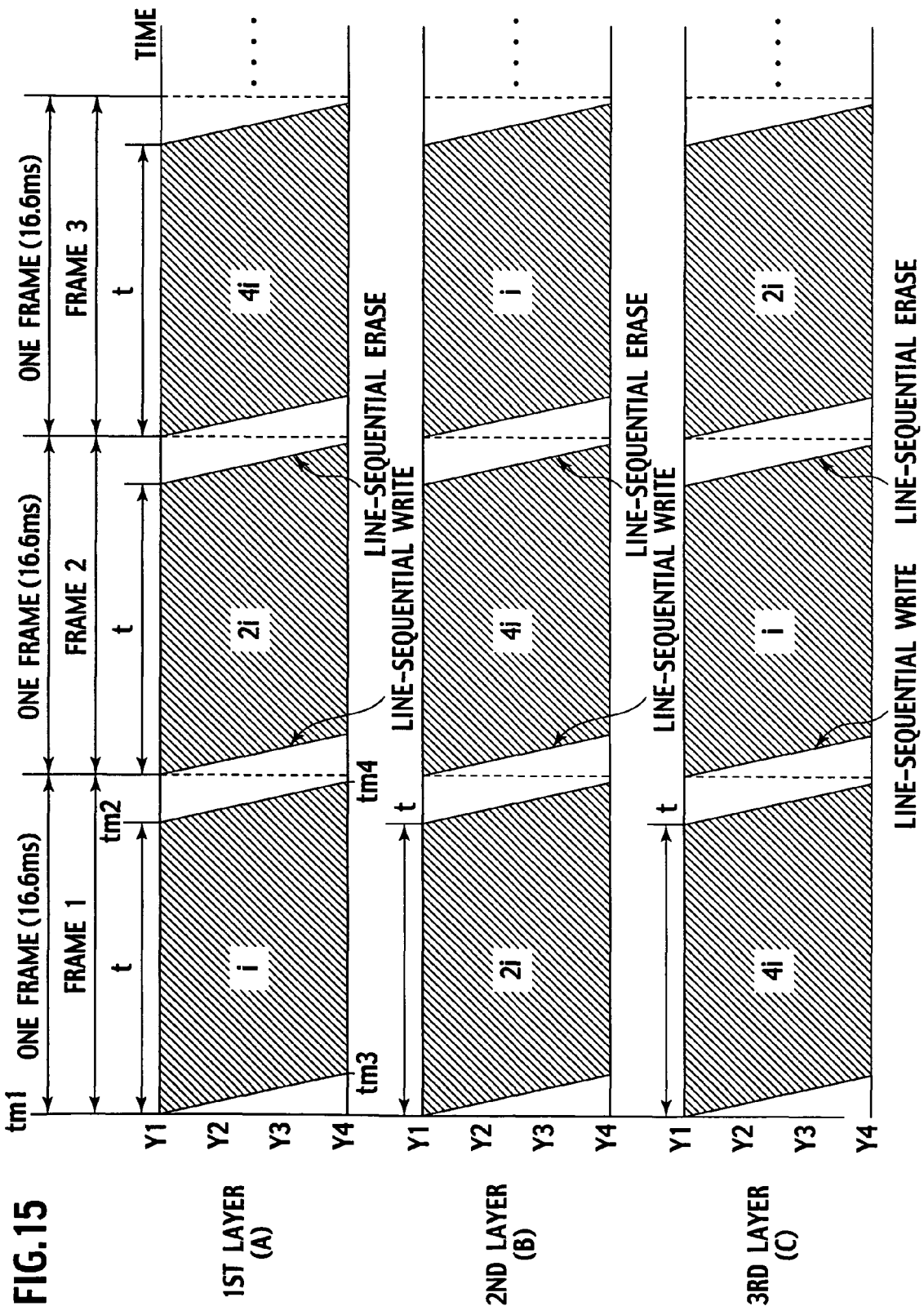
FIG. 15 is a timing chart showing a fifth example of brightness weighting.

FIG. 15 is a timing chart showing the fifth example. In FIG. 15, (A) to (C) represent states of currents applied to the first to third organic EL emission layers. In a vertical direction of FIG. 15, there are rows of the display panel. In this example, there are rows Y1 to Y4 as shown in FIG. 11. A horizontal direction of FIG. 15 indicates time. Each frame spans 16.6 milliseconds (ms). Frames are sequentially changed from one to another according to time.

At time tm1, the gate driver 391 of FIG. 11 turns on pixels 362 in the row Y1, and the pixels 362 in the row Y1 are driven for a time length of t up to time tm2. Thereafter, the gate driver 392 drives pixels 362 in the row Y2 for a time length of t. In this way, the gate drivers 391 to 394 sequentially turn on the rows Y1 to Y4. At time tm3, the row Y4 is turned on and is driven for a time length of t up to time tm4.

(Sixth Example of Weighting)

FIG. 14B shows a table according to a sixth example of brightness weighting. The sixth example passes the same current value to the first to third emission layers for different time lengths, to provide weights frame by frame. In the first frame, the first layer is set to a time length of t, the second layer to a time length of 2t, and the third layer to a time length of 4t. In the second frame, the first layer is set to a time length of 2t, the second layer to a time length of 4t, and the third layer to a time length of t. In the third frame, the first layer is set to a time length of 4t, the second layer to a time length of t, and the third layer to a time length of 2t. In this way, weights set for the organic EL emission layers are changed from frame to frame. The fourth frame and frames that follow repeat the time lengths set for the first to third frames.

In this way, the sixth example changes time lengths applied to the emission layers according to the table of FIG. 14B stored in the time length table holder 80.

The sixth example repeats the time lengths for passing currents to the emission layers every three frames. Accordingly, the sixth example prepares three kings of brightness weighting.

The setting of the sixth example equalizes a total current passing period among the emission layers, to equalize service life among the emission layers. According to the sixth example, each emission layer emits light in a time division manner (PWM), to precisely express gradation levels.

Figure 16:
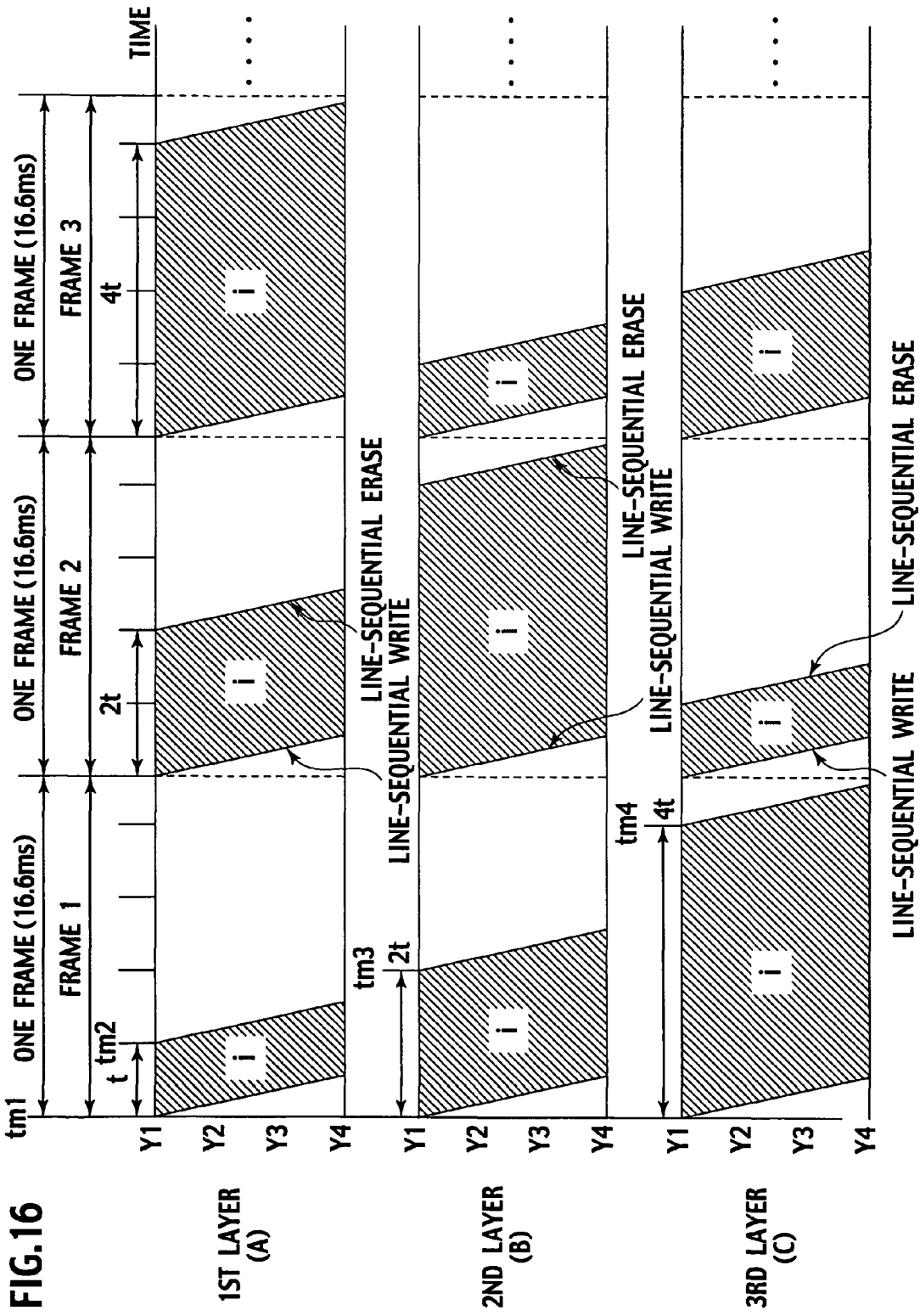
FIG. 16 is a timing chart showing a sixth example of brightness weighting.

FIG. 16 is a timing chart showing operation of the sixth example. In FIG. 16, (A) to (C) indicate states of currents applied to the first to third organic emission layers. An abscissa and ordinate of FIG. 16 show rows and time like FIG. 15. A time length of t shown in FIG. 16 is equal to ¼ of a time length of t shown in FIG. 15. Namely, a time length of 4t of FIG. 16 is equal to a time length of t of FIG. 15.

Like the fifth example, the pixels 362 in the row Y1 are turned on at time tm1. Then, the first layer of each pixel 362 is driven for a time length of t up to time tm2, the second layer of each pixel 362 is driven for a time length of 2t up to time tm3, and the third layer of each pixel 362 is driven for a time length of 4t up to time tm4.

(Seventh Example of Weighting)

FIG. 14C shows a table according to a seventh example of brightness weighting. The seventh example supplies different current values to the emission layers for different time lengths. The current values and time lengths are changed frame by frame to provide different brightness weights for the emission layers. In the first frame shown in FIG. 14C, the first layer receives a current value of i for a time length of t, the second layer a current value of (3/2)i for a time length of (4/3)t, and the third layer a current value of 2i for a time length of 2t. In the second frame and frames that follow, combinations of the current values and time lengths that provide the brightness weights of 1, 2, and 4 are repeated every three frames in each layer. Namely, in each layer, the combinations of current values and time lengths that provide the brightness weights of 1, 2, and 4 are achieved once in the first to third frames. At this time, the total brightness of the three layers is fixed to 7 in each frame. The fourth frame and frames that follow repeat the weighting combinations applied to the first to third frames. Order of the combinations to be repeated may be changed every three frames or may be unchanged.

The seventh example prepares three combinations of time lengths and current values, to provide three kinds of brightness weighting.

The seventh example averages current values and time lengths among the emission layers, to thereby equalize the service life of each emission layer. Each emission layer of the seventh example emits light in a time division manner (PWM) to precisely express gradation.

Figure 17:
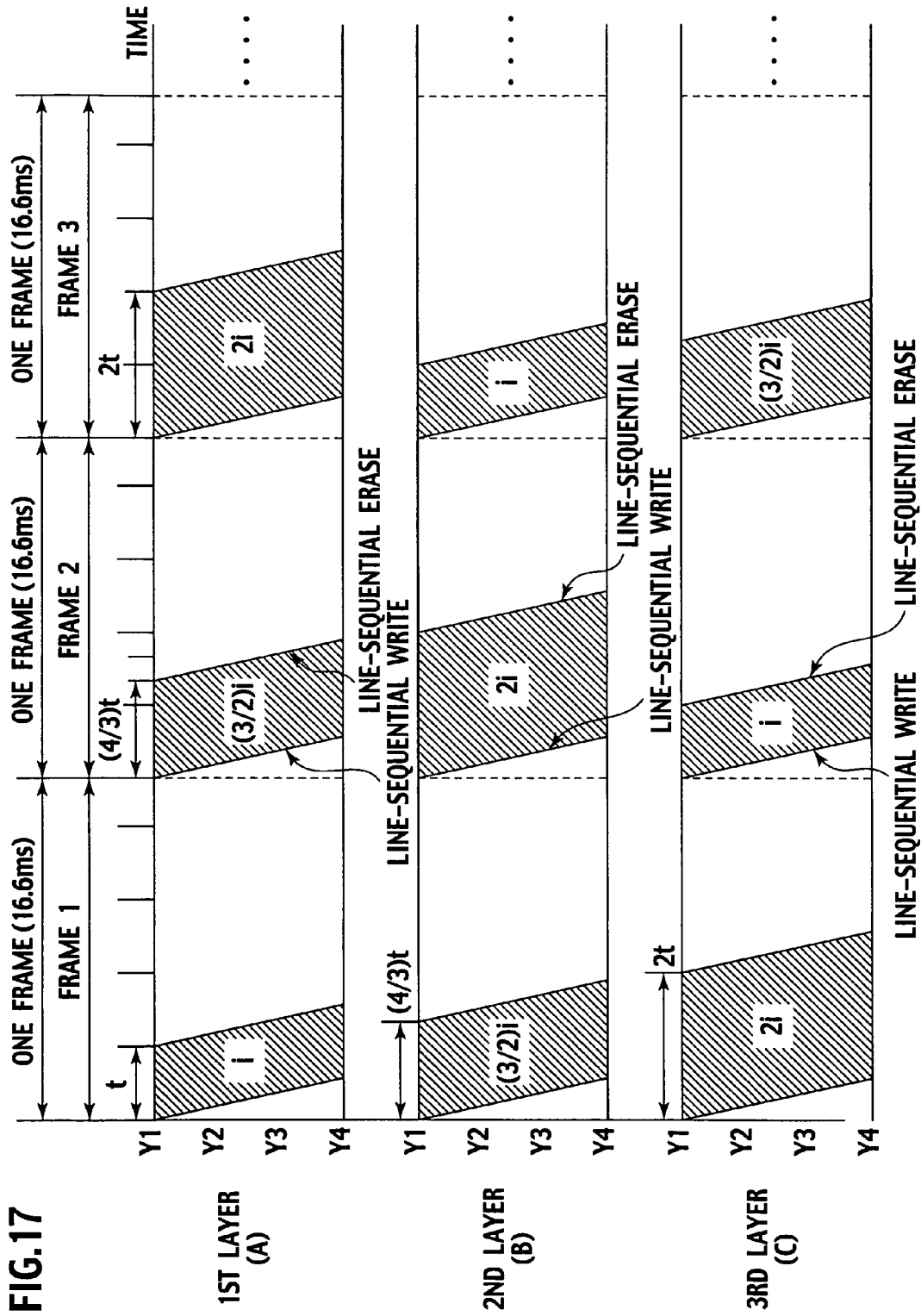
FIG. 17 is a timing chart showing a seventh example of brightness weighting.

FIG. 17 is a timing chart showing the seventh example. In FIG. 17, (A) to (C) indicate states of currents applied to the first to third organic emission layers. The explanation made with reference to FIG. 16 is basically applicable to FIG. 17.

FIG. 14A to 14C showed brightness weighting examples employing three organic emission layers. These examples do not limit the present invention. The present invention is applicable to a structure with more organic emission layers. If there are n organic emission layers, weights for the n layers are changed frame by frame, so that m (m is a natural number equal to or smaller than n) combinations of current values and time lengths are repeated every n frames. As mentioned above, the total brightness with all emission layers emitting light is fixed through frames. When all emission layers emit light in each frame, the total brightness of each emission layer reaches a fixed value every n frames.

In FIGS. 14A to 14C, the organic emission layers receive different current values and time lengths, respectively. This does not limit the present invention. For example, the first to third layers may each receive the same current value or time length value of, for example, 1. Alternatively, the first to third layers may partly receive the same current value or time length value, such as 1, 2, and 2, respectively.

In the examples mentioned above, the first to third organic emission layers, or the first to fifth organic emission layers are made of the same material. This does not limit the present invention. The organic emission layers may be made of different materials. Even so, current values and current passing periods for the organic emission layers may be differed as mentioned above to set a total brightness weight of 1 for the first layer, 2 for the second layer, and 4 for the third layer in the case of FIG. 7A, and a total brightness weight of 1 for the first layer, 2 for the second layer, 4 for the third layer, 8 for the fourth layer, and 16 for the fifth layer in the case of FIG. 7B.

In this way, the second embodiment sets brightness weights for n emission layers, respectively, and makes the n emission layers emit light to display a gradation level on the corresponding dot. Compared with the related art that supplies a current to a single emission layer to express a gradation level, the second embodiment can extend the service life of each emission layer. The second embodiment expresses a gradation level without repeating ON and OFF operations, to thereby prevent flickering. The second embodiment employs a digital driving technique, and therefore, can eliminate brightness unevenness caused by the characteristics of TFTs serving as driving elements.

The second embodiment fixes one of the current value and current passing period applied to the emission layers of a light emitting element and prepares m kinds of values for the other. Alternatively, the second embodiment prepares m combinations of current value and current passing period for the emission layers. The m kinds of values or the m combinations are repeated every n frames (or n fields in the case of an interlace driving system). This results in averaging the total current value and total time length among the emission layers, to equalize the service lives of the emission layers.

Third Embodiment

A pixel in a display according to a third embodiment of the present invention will be explained in detail. The first and second embodiments each employ a pixel composed of organic emission layers that are digitally driven. The third embodiment employs pixels each composed of emission layers that are driven in an analog mode and emission layers that are digitally driven.

Figure 18:
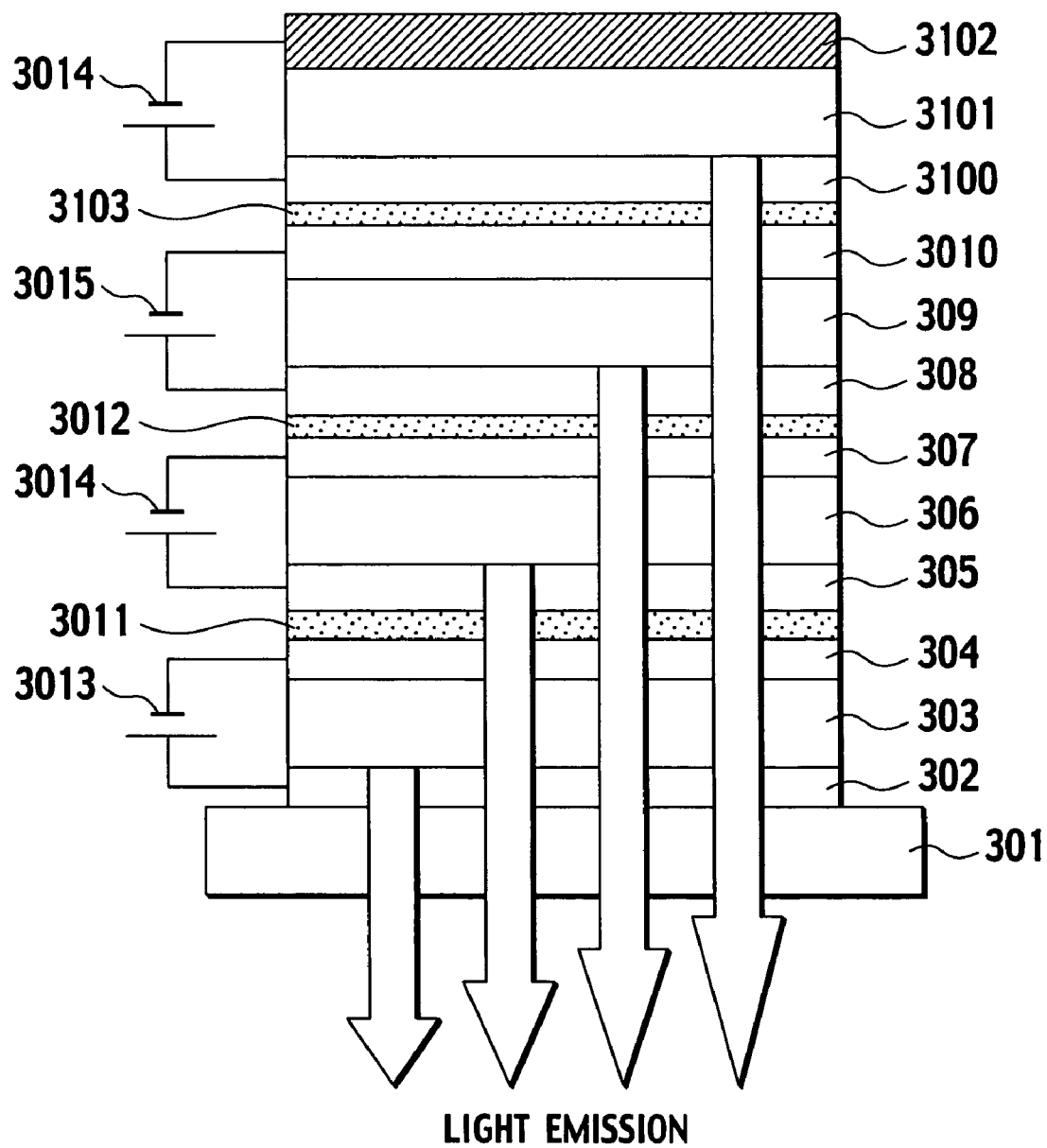
FIG. 18 is a view showing a layer structure of a pixel in a display according to a third embodiment of the present invention.

FIG. 18 shows a layer structure of a pixel in the display according to the third embodiment. A glass substrate 301 is a screen of the display. The glass substrate 301 may be made of, for example, plastic material suitable for forming organic film layers thereon. On the glass substrate 301, an anode 302 is formed. The anode 302 is, for example, a transparent ITO electrode.

On the anode 302, an organic emission layer 303 is formed. The organic emission layer 303 is a combination of a hole injection layer, a hole transport layer, an electron injection layer, an electron transport layer, and an emission layer made of organic luminescent compounds. The combination must be properly selected according to organic EL characteristics.

On the organic emission layer 303, a cathode 304 is formed. If the cathode 304 is a transparent ITO electrode, it will not operate as a cathode if used as it is. It is necessary to insert, for example, a thin lithium cathode between the ITO electrode and the organic emission layer 303.

A power source 3013 is connected to apply a DC voltage between the anode 302 and the cathode 304. A light emitting principle of the organic emission layer 303 held between the anode 302 and the cathode 304 is the same as that of the related art.

On the cathode 304, a silicon oxide film 3011 and an anode 305 are sequentially laid one over another. The silicon oxide film 3011 insulates the cathode 304 from the anode 305.

On the anode 305, an organic emission layer 306, a cathode 307, a silicon oxide film 3012, an anode 308, an organic emission layer 309, a cathode 3010, a silicon oxide film 3103, an anode 3100, an organic emission layer 3101, and a cathode 3102 are sequentially formed. The third embodiment employs a bottom emission structure that emits no light from the cathode 3102. Accordingly, the cathode 3102 is made of metal such as aluminum.

A power source 3014 is connected to apply a DC voltage between the anode 305 and the cathode 307. A power source 3015 is connected to apply a DC voltage between the anode 308 and the cathode 3010. A power source 3102 is connected to apply a DC voltage between the anode 3100 and the cathode 3102. As a result, the organic emission layers 306, 309, and 3101 receive DC-voltage-converted currents from the power sources 3014, 3015, and 3104 through the anodes and cathodes.

The organic emission layers 303, 306, 309, and 3101 emit light at brightness levels proportional to the converted current values, respectively, and the light is emitted from the glass substrate 301. This structure is naturally applicable not only to organic EL displays but also to inorganic EL displays. Also, it is applicable not only to active driving displays but also to passive driving displays.

The organic emission layers 303, 306, and 309 are switched between on and off (light emission and no light emission) states according to two values, i.e., on and off values of the respective power sources. Each of the organic emission layers 303, 306, and 309 is formed from a material selected to emit light at a predetermined brightness.

On the other hand, the organic emission layer 3101 is made of material whose brightness changes in proportion to the quantity of a current supplied from the power source 3104. Namely, the organic emission layer 3101 is an analog driven emission layer whose brightness changes under a current changing operation. The emission layer 3101, therefore, can emit light of a halftone level. The element structure according to the third embodiment includes the three digital driven emission layers and one analog driven emission layer.

Figure 19:
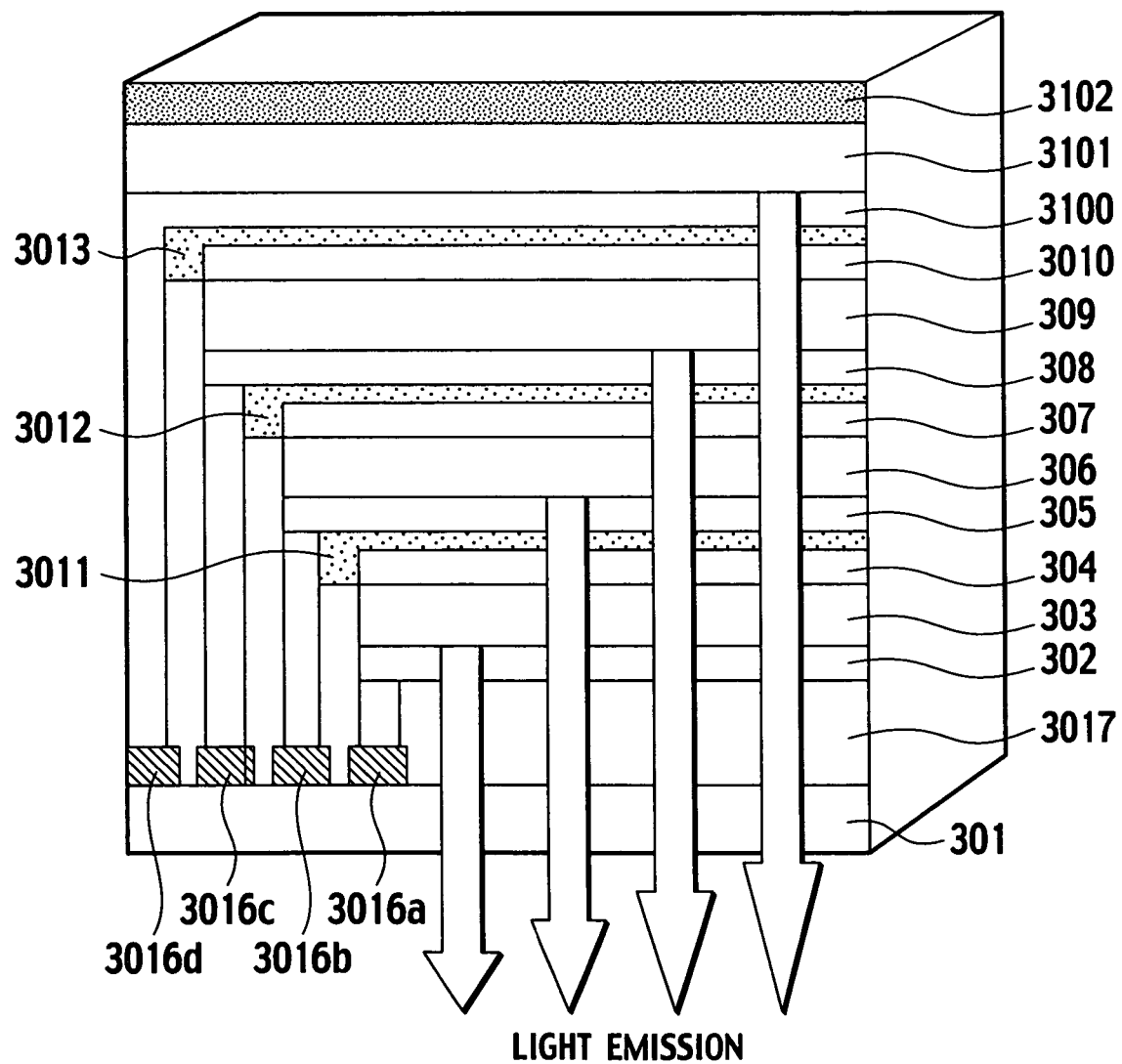
FIG. 19 is a view showing a pixel structure according to the third embodiment.

FIG. 19 shows a pixel structure of the display according to the third embodiment of the present invention. In FIG. 19, the same parts as those of FIG. 18 are represented with the same reference marks and the explanation thereof is omitted. FIG. 19 shows one of color dots (for example, red, green, and blue dots) that form a pixel. On the glass substrate 301, thin film transistors (TFTs) 3016a, 3016b, 3016c, and 3016d serving as active elements are formed and are connected to the anodes 302, 305, 308, and 3100, respectively. The TFTs 3016a to 3016d may be any active elements made of p-Si (low-temperature polysilicon), a-Si (amorphous silicon), or the like if they can drive and control the organic emission layers 303, 306, 309, and 3101.

The TFTs 3016a to 3016d function to turn on and off power applied from the power sources to the organic emission layers 303, 306, 309, and 3101, respectively. A silicon oxide film 3017 formed between the glass substrate 301 and the anode 302 prevents metal ions from migrating from the glass substrate 301 to the anode 302. The cathodes 304, 307, 3010, and 3102 form a common electrode.

To emit light from the glass substrate 301 that is at the bottom of the pixel shown in FIG. 19, the cathode 3102 at the top of the pixel must not leak light. To achieve this, the cathode 3102 is made of metal such as aluminum. Light emitted from the organic emission layers 303, 306, 309, and 3101 advances in upward and downward directions. The light advanced toward the cathode 3102 is reflected with the cathode 3102 and is oriented toward the bottom. Consequently, light is emitted only from the glass substrate 301.

According to the third embodiment, the glass substrate 301 is provided with the TFTs 3016a to 3016d, and the bottom emission structure emits light from the glass substrate 301. It is possible to make the cathode 3102 from a transparent material and the anode 302 from metal such as aluminum, to thereby form a top emission structure that emits light from the cathode 3102.

A plurality of the TFTs 3016a to 3016d are usually needed. The TFTs 3016a to 3016d are collectively referred to as an element driver (first driver). Each organic emission layer and a corresponding element driver form a unit element. The organic EL display shown in FIG. 18 has four emission layers in a vertical direction on the screen of the display. Namely, the display has four-layer light emitting elements.

A brightness weighting method applied to the organic emission layers 303, 306, and 309 in each pixel according to the third embodiment shown in FIGS. 18 and 19 is the same as that already explained with reference to FIGS. 7A and 7B. The organic emission layers 303, 306, and 309 are hereinafter referred to as the first, second, and third layers, respectively.

The example shown in FIG. 7B has five organic emission layers. The five-layer structure may be formed by adding one unit element to the structure of FIGS. 18 and 19. From the light emitting side, the five organic emission layers are referred to as the first, second, third, fourth, and fifth layers, respectively.

The display according to the third embodiment may employ the same pixel gradation expressing method explained with reference to FIG. 8.

Figure 20:
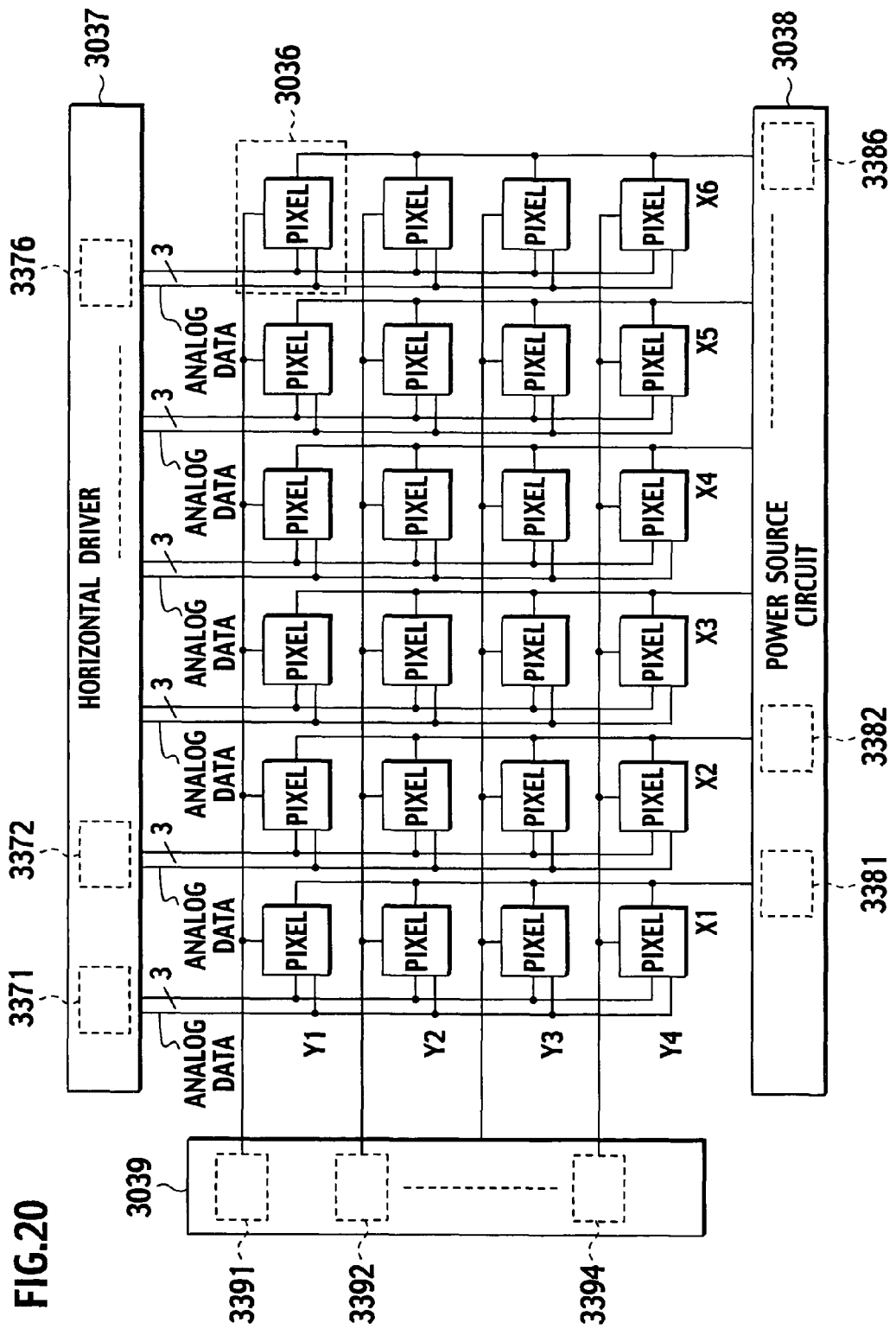
FIG. 20 is a view showing a structure for driving a display panel according to the third embodiment.

FIG. 20 is a view showing a structure for driving a display panel of the display according to the third embodiment of the present invention. In FIG. 20, each pixel 3036 corresponds to a pixel circuit to be explained later with reference to FIG. 21. The display panel includes a plurality of pixels 3036 that are arranged in a two-dimensional matrix. A horizontal driver 3037 supplies analog data and 3-bit digital data to the pixels 3036. A power source circuit 3038 drives the pixels 3036. A vertical driver 3039 sequentially selects lines in a vertical direction.

The pixels 3036 are in rows Y that are arranged in a vertical direction and in columns X that are arranged in a horizontal direction. The rows Y and columns X form the two-dimensional matrix. According to the example of FIG. 20, the display panel includes four rows Y1 to Y4 and six columns X1 to X6. Although an actual display panel includes more rows and columns, the display panel of FIG. 20 has smaller numbers of rows and columns for the convenience of explanation. According to the third embodiment, the horizontal driver 3037 includes data drivers 3371 to 3376, the power source circuit 3038 includes power source units 3381 to 3386, and the vertical driver 3039 includes gate drivers 3391 to 3394. The horizontal driver 3037 and vertical driver 3039 collectively serve as a second driver.

To scan the top row Y1 of the display panel in FIG. 20, the gate driver (gate TFT) 3391 of the vertical driver 3039 turns on each pixel 3036 in the row Y1. At the same time, the gate drivers 3392 to 3394 turn off the other rows Y2 to Y4. At this time, the horizontal driver 3037 supplies image data (consisting of digital data and analog data) for one line to the pixels 3036 in the row Y1.

Thereafter, the gate driver 3391 turns off the pixels 3036 in the row Y1, to display an image on the row Y1. In this way, the vertical driver 3039 sequentially drives the gate driver 3392 for the row Y2 to the gate driver 3394 for the row Y4, and the horizontal driver 3037 outputs image data row by row, to scan all pixels 3036 in the display panel.

Figure 21:
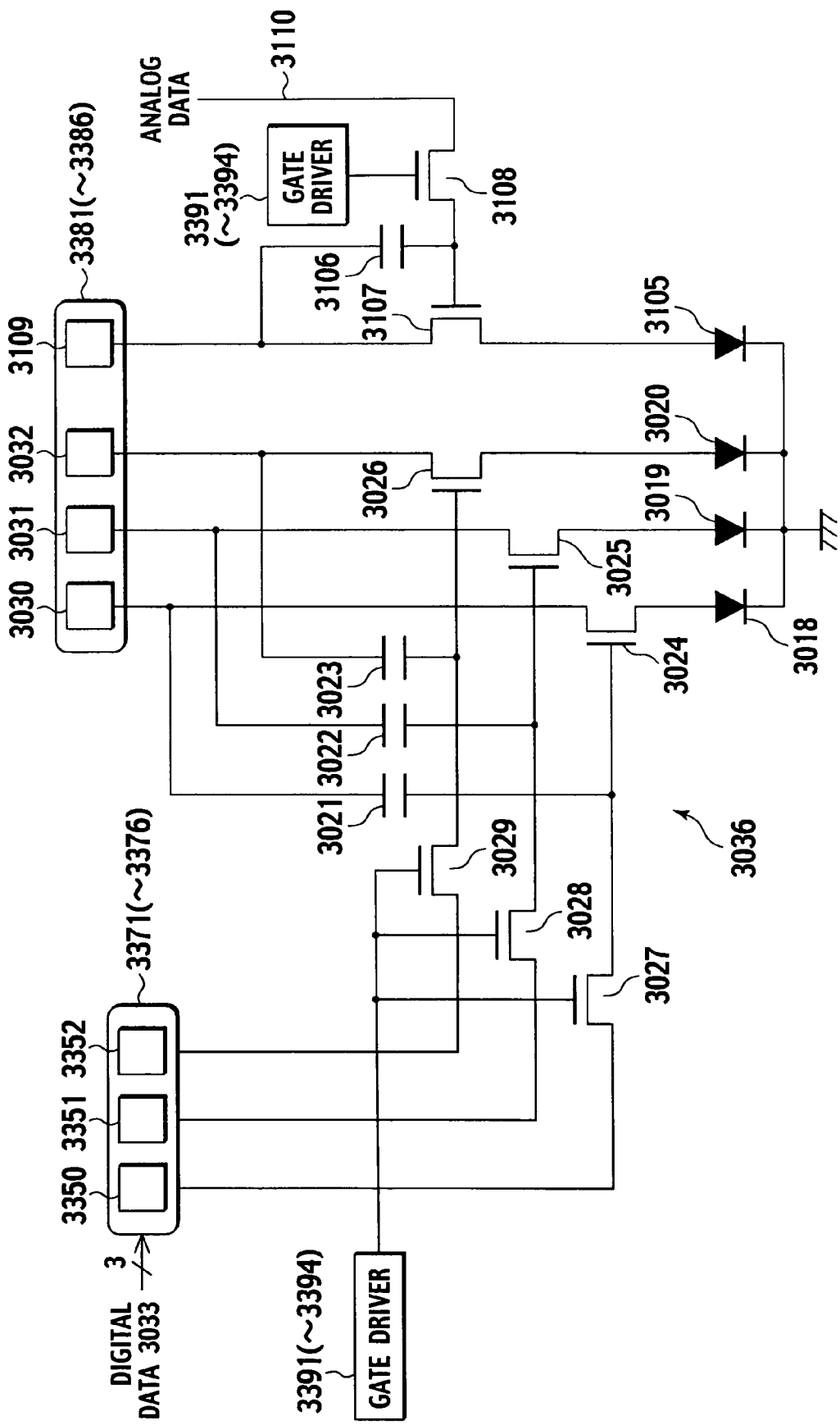
FIG. 21 is a view showing a circuit for driving a pixel according to the third embodiment.

FIG. 21 is a circuit diagram showing a circuit for driving a pixel in the display according to the third embodiment. In FIG. 21, organic EL emission layers 3018, 3019, 3020, and 3105 correspond to the organic emission layers 303, 306, 309, and 3101 of FIGS. 18 and 19, respectively. Each pixel according to the third embodiment has the four-layer structure with three digital layers and one analog layer. Brightness weights assigned to the digital layers are 1, 2, and 4, respectively, like the example of FIG. 7A.

One ends (anodes in FIG. 21) of the organic EL emission layers 3018 to 3020 and 3105 are connected through the sources and drains of driving TFTs 3024 to 3026 and 3107 to power sources 3030 to 3032 and 3109 that form the power source unit 3381. The gates of the TFTs 3024 to 3026 and 3107 are connected to the sources of TFTs 3027 to 3029 and 3108, respectively, and through capacitors 3021 to 3023 and 3106 to the power sources 3030 to 3032 and 3109, respectively.

The power sources 3030, 3031, 3032, and 3109 correspond to the power sources 3013, 3014, 3015, and 3104 of FIG. 18. The power sources 3030 to 3032 and 3109 may be discrete power sources or may form a common power source. These power sources are set to make the organic EL emission layers 3018 to 3020 and 3105 emit light at their respective weights and brightness levels. The drains of the TFTs 3027 to 3029 are connected to data holders 3350 to 3352 in a data driver 3371, and the gates of these TFTs are commonly connected to the gate driver 3391. The gate of the TFT 3107 receives analog data 3110 through the source and drain of the TFT 3108.

The structures of the data driver 3371, power source unit 3381, and gate driver 3391 shown in FIG. 21 are also applicable to data drivers 3372 to 3376, power source units 3382 to 3386, and gate drivers 3392 to 3394 as indicated in FIG. 21. The data drivers 3371 to 3376, power source units 3381 to 3386, and gate drivers 3391 to 3394 drive the pixels 3036 in the rows Y and columns X of the display panel.

For the sake of convenience, FIG. 21 shows as if the gate driver 3391 (up to 3394) is divided into two, one connected to the gate transistors 3027 to 3029 and the other to the gate transistor 3108.

Operation of the drive circuit of FIG. 21 will be explained. First, a digital driving operation will be explained. This operation digitally drives the digital organic EL emission layers 3018, 3019, and 3020 according to ON and OFF values to emit light or no light.

Digital data 3033 (three bits) with a predetermined gradation level to be displayed on the pixel 3036 is supplied to the data driver 3371. The data 3033 is preferably digital serial data or parallel data. The data 3033 supplied to the data driver 3371 is used to turn on those of the organic EL emission layers 3018 to 3020 corresponding to the gradation level to be displayed.

The bits (each being 1 or 0) of the data 3033 are stored in the data holders 3350 to 3352, respectively. The gate driver 3391 applies a first potential to the gates of the gate transistors 3027 to 3029, thereby turning on the gate transistors 3027 to 3029. The data driver 3371 outputs the data, which is transferred through the drains and sources of the gate transistors 3027 to 3029 to the capacitors 3021 to 3023, which store the data.

Thereafter, the gate driver 3391 applies a second potential to the gates of the gate transistors 3027 to 3029, to turn off the gate transistors 3027 to 3029. Once the gate transistors 3027 to 3029 are turned off, the capacitors 3021 to 3023 hold accumulated charges. The charges held in the capacitors 3021 to 3023 correspond to the potential differences between the voltages of the power sources 3030 to 3032 and the output voltages of the data driver 3371.

Displaying an image with a gradation level of, for example, 5 on the display will be explained. According to FIG. 8, the gradation level of 5 is achievable by turning on the first and third organic EL emission layers 3018 and 3020. In this embodiment, the organic EL emission layer 3018 is the first layer, the organic EL emission layer 3019 is the second layer, and the organic EL emission layer 3020 is the third layer.

The input data 3033 is converted by the data driver 3371 into a data string connected to signal lines of the corresponding organic EL emission layers. Here, the data holders 3350 and 3352 hold data to make the organic EL emission layers 3018 and 3020 emit light.

At this time, the capacitor 3021 receives a voltage to turn on the TFT 3024, and the capacitor 3023 receives a voltage to turn on the TFT 3026. As a result, the TFTs 3024 and 3026 are turned on. On the other hand, the capacitor 3022 receives no voltage for driving the TFT 3025, and therefore, the TFT 3025 is in an OFF state.

Since the TFTs 3024 and 3026 are ON, currents from the power sources 3030 and 3032 are passed through the drains and sources of the TFTs 3024 and 3026 to the organic EL emission layers 3018 and 3020, which thus emit light. At this time, the organic EL emission layers 3018 and 3020 have the brightness weights of 1 and 4, respectively, and therefore, the total gradation level of 5 is displayed on the display.

Next, an analog driving operation of the organic EL emission layer 3105 to emit light of a halftone level will be explained. First, analog data 3110 having a gradation level to be displayed with the pixel is provided. The gradation level of the analog data 3110 corresponds to a brightness level that is smaller than a minimum brightness level expressible with the digital data 3033.

An example of displaying a gradation level of 0.3 on the display will be explained. In response to the input analog data 3110, the gate driver 3391 turns on the TFT 3108. Then, the analog data 3110 is passed through the drain and source of the TFT 3108 and is accumulated in the capacitor 3106 serving as a data holder. Thereafter, the gate driver 3391 turns off the TFT 3108, and therefore, the capacitor 3106 holds the analog data 3110.

The charge held in the capacitor 3106 corresponds to a potential difference between the power source 3109 and the analog data 3110 and can pass a current representative of the gradation level of 0.3 to the driving TFT 3107. The charge in the capacitor 3106 drives the driving TFT 3107, so that a current from the power source 3109 is passed through the drain and source of the TFT 3107 to the organic EL emission layer 3105, which emits light to display the gradation level of 0.3 on the display.

According to the digital driving technique of the third embodiment, the TFTs 3024 to 3026 shown in FIG. 21 are only turned on and off. Accordingly, the circuit configuration of the third embodiment is simple with the capacitors 3021 to 3023 for storing data being used to turn on and off the driving TFTs 3024 to 3026 and the gate transistors 3027 to 3029 being used to make the capacitors 3021 to 3023 hold the data. The driving TFTs 3024 to 3026 according to the third embodiment are only turned on and off. Namely, these transistors are operated in a saturation region. Due to this, the third embodiment is free from the problem of threshold variations in active TFTs of the related art. As a result, the third embodiment can minimize brightness unevenness and gradation deviation over a display panel.

The digital driving method of the third embodiment only turns on and off (switching operation) the driving TFTs 3024 to 3026, to operate them in a saturation region involving a minimum TFT power loss. As a result, the third embodiment can reduce power consumption compared with the related art.

According to the third embodiment, a lighting current is distributed to a plurality of emission layers. It is said that the service life of an organic EL emission layer is inverse proportion to the square of a current value. Distributing a current to a plurality of layers reduces a current quantity to each layer, to thereby extend the service life of the display compared with a display employing a conventional circuit configuration.

The third embodiment employs the digital driving technique and analog driving technique, in which the analog data 3110 represents a gradation level corresponding to a brightness level that is smaller than a minimum brightness level expressible with the digital data 3033. This does not limit the present invention. The analog data 3110 may represent a gradation level corresponding to a brightness level that is greater than a maximum brightness level expressible with the digital data 3033.

(First Example of Gradation Expression)

An example of gradation expression with a pixel in the display according to the third embodiment will be explained.

Figure 22:
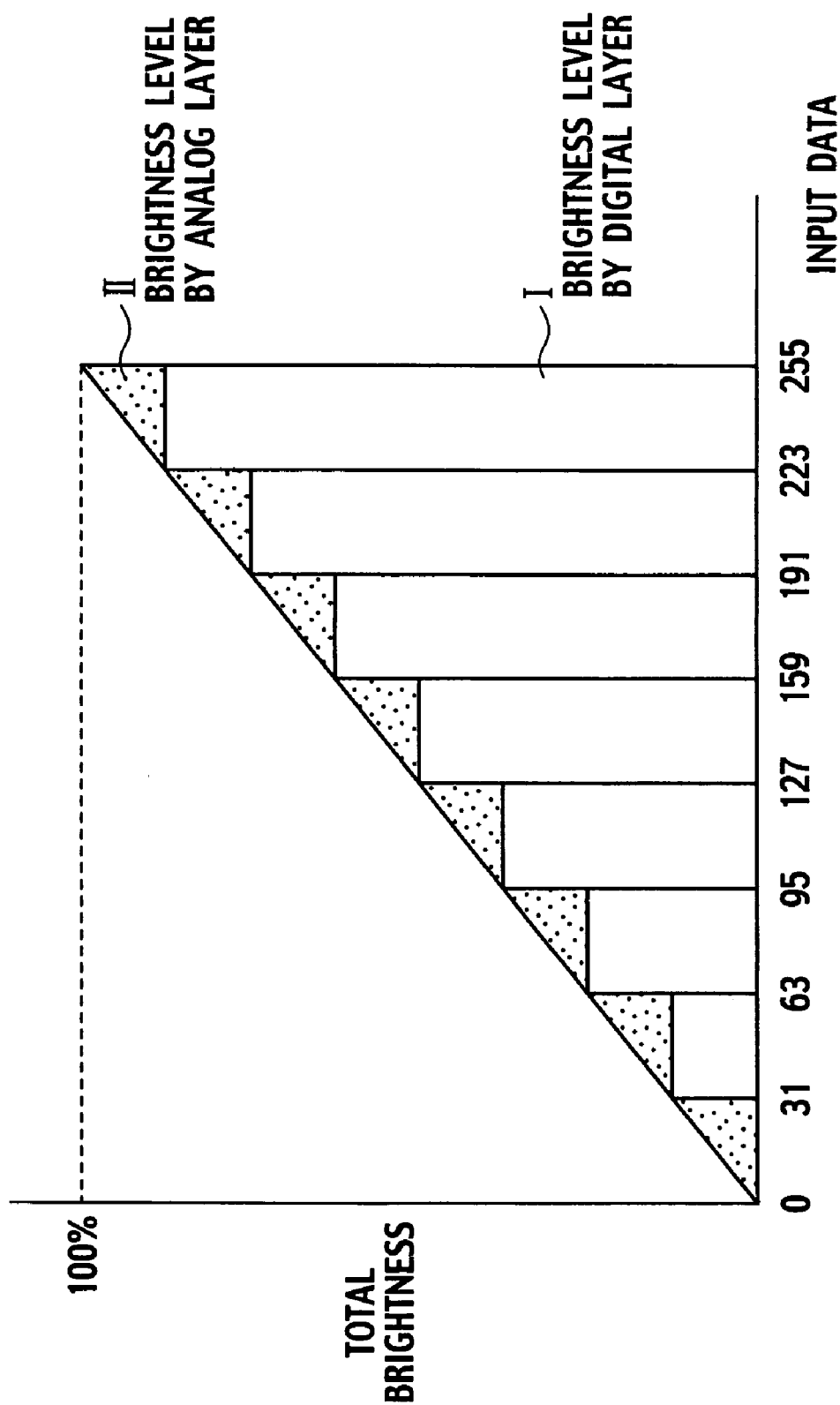
FIG. 22 is a view explaining a first example of gradation expression.

FIG. 22 shows a technique of expressing linear gradation with the use of the pixel of the third embodiment shown in FIG. 18. As explained above, a digitally driven emission layer emits light or no light in response to an ON/OFF operation of a power source, and an analog driven emission layer changes the brightness of emission in response to the value of a current.

In FIG. 22, an ordinate indicates the total brightness of emission from a pixel, and an abscissa indicates input data (input gradation) to the pixel. These definitions of ordinate and abscissa are applicable to FIGS. 23 to 25 to be explained later. The total brightness of emission from a pixel is the total brightness of light emitted from a plurality of organic emission layers of the pixel.

Three digital driven layers laid one over another can express eight gradation levels including 0. This results in creating large steps among the brightness levels as indicated with I in FIG. 22, to hardly express fine gradation. Increasing the number of digital driven emission layers may increase the number of expressible gradation levels. This, however, complicates a panel structure as well as a processing scheme.

To solve the problem, the third embodiment adds an analog driven emission layer to each pixel, to compensate the large steps created by the digital driven emission layers. More precisely, when input data consists of a multiple of 32 such as 32, 64, 96, 128, 160, 192, and 224, gradation levels expressed with the digital driven emission layers are sequentially increased from 0 to 7 by weighting the first to third organic EL emission layers 303, 306, and 309. The weights assigned to the first to third layers are the same as those shown in FIG. 7A.

If input data is within the range from 0 to 31, the digital driver for driving the digital driven emission layers sets a gradation level of 0. The analog driver for driving the analog driven emission layer sets a gradation level so that the organic emission layer 3101 may emit light according to the input data in the range from 0 to 31.

If input data is within the range from 32 to 63, the digital driven emission layers are set to provide a gradation level of 1. The analog driven emission layer is controlled to emit light at a gradation level in the range from 0 to 31 that is obtained by subtracting 32 from the input data in the range from 32 to 63. If input data is within the range from 64 to 95, the digital driven emission layers are set to provide a gradation level of 2. The analog driven emission layer is controlled to emit light at a gradation level in the range from 0 to 31 that is obtained by subtracting 64 from the input data in the range from 64 to 95. If input data is within the range from 96 to 127, the digital driven emission layers are set to provide a gradation level of 3. The analog driven emission layer is controlled to emit light at a gradation level in the range from 0 to 31 that is obtained by subtracting 96 from the input data in the range from 96 to 127.

Similarly, input data in the range from 128 to 159, from 160 to 191, from 192 to 223, or from 224 to 255 is handled by setting the digital driven emission layers to provide a gradation level of 4, 5, 6, or 7 and by controlling the analog driven emission layer to emit light at a gradation level in the range from 0 to 31.

With this setting, the brightness level, i.e., gradation level provided by the analog driven emission layer will be linear as indicated with II in FIG. 22. In this way, the analog driven emission layer is superior to the digital driven emission layer in realizing multiple gradation levels, and the digital driven emission layer is superior to the analog driven emission layer in reducing brightness unevenness.

(Second Example of Gradation Expression)

Figure 23:
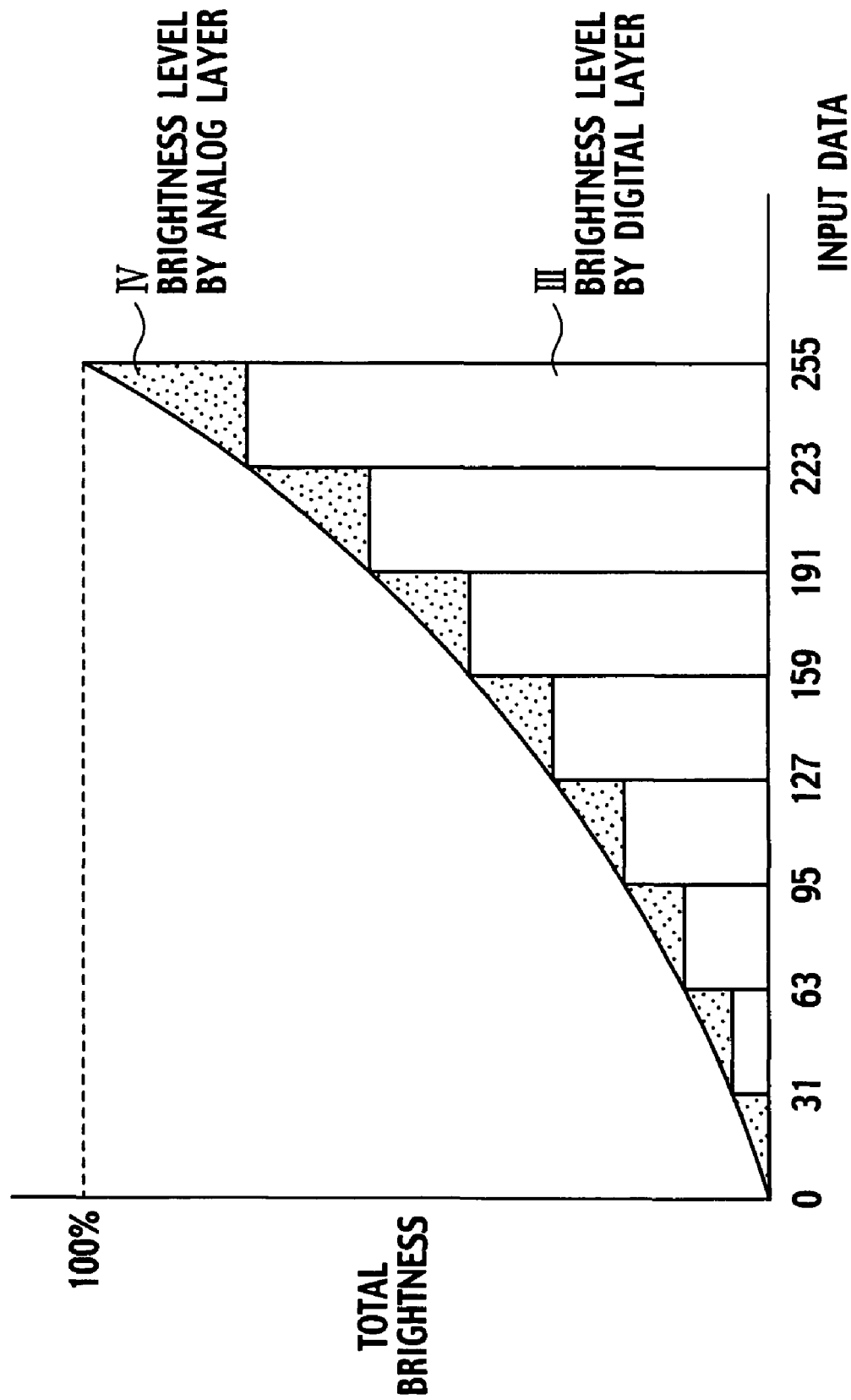
FIG. 23 is a view explaining a second example of gradation expression.

FIG. 23 shows a second example of gradation expression with a gamma characteristic that is nonlinear unlike FIG. 22. A pixel structure only with digital driven emission layers hardly achieves fine gradation because the digital driven emission layers create large brightness steps as indicated with III in FIG. 23. To solve this problem, an analog driven emission layer is added to compensate the large gradation steps created by the digital driven emission layers.

Unlike the first example shown in FIG. 22 that makes the gradation level of the analog driven emission layer proportional to input data in the range from 0 to 31, the second example makes the analog driven emission layer emit light according to a gamma characteristic. Namely, the second example controls the brightness level of the analog driven emission layer to show a characteristic IV shown in FIG. 23, so that the total brightness of the pixel may follow the gamma characteristic curve shown in FIG. 23 according to input data.

The analog driven emission layer is superior to the digital driven emission layer in realizing multiple gradation levels, and the digital driven emission layer is superior to the analog driven emission layer in reducing brightness unevenness. The gamma correction is adjustable according to the characteristics of a display.

(Third Example of Gradation Expression)

Figure 24:
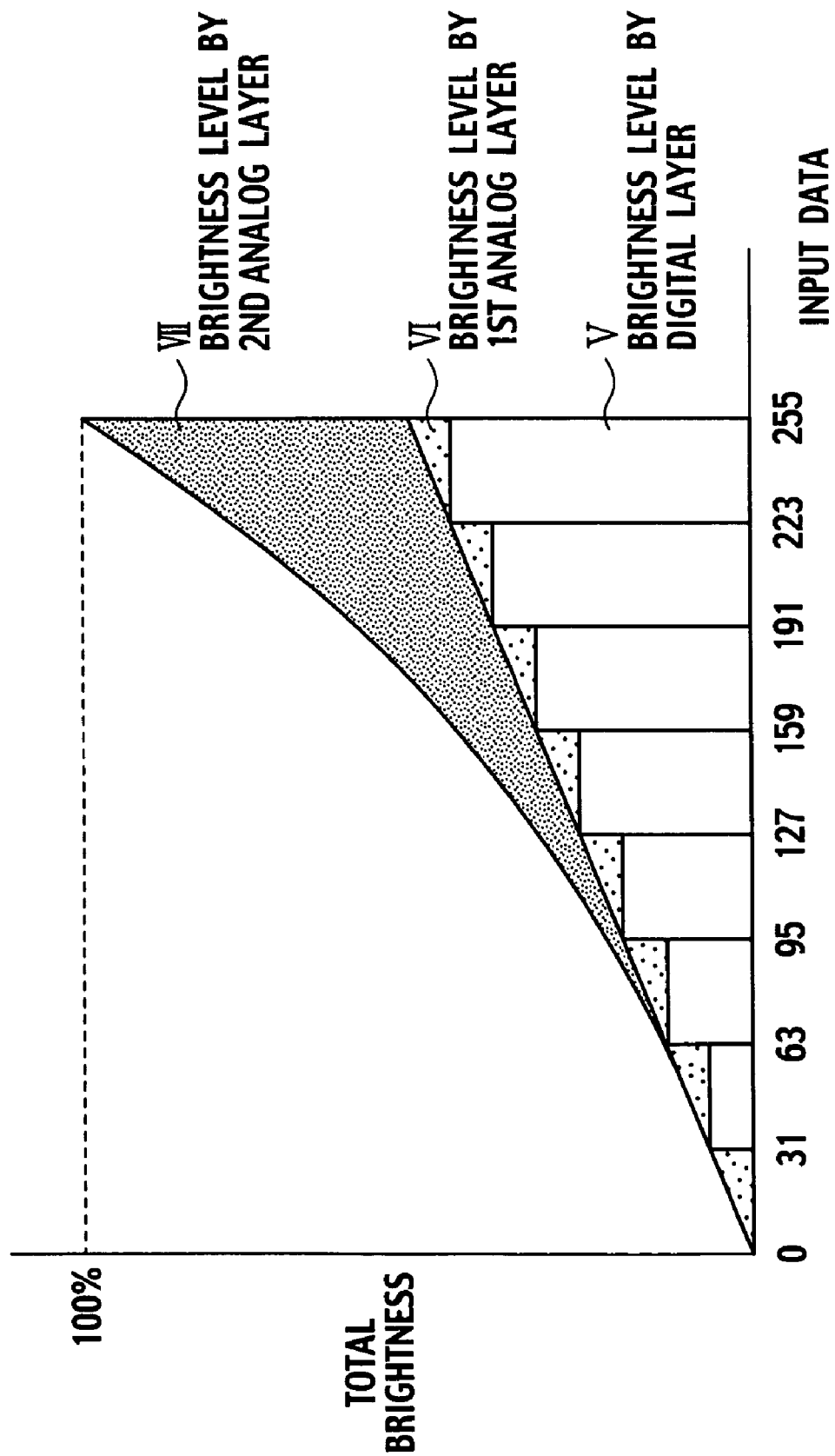
FIG. 24 is a view explaining a third example of gradation expression.

FIG. 24 shows a third example of gradation expression with a gamma characteristic. This example employs three digital driven emission layers and two analog driven emission layers to form a multilayer light emitting element. As explained above, a three-layer structure with three digital driven emission layers can only express eight gradation levels including 0. The digital driven emission layers hardly achieve a gamma characteristic because the digital driven emission layers create large brightness steps as indicated with V in FIG. 24.

To solve the problem, the first analog driven emission layer of the third example compensates the large gradation steps created by the digital driven emission layers, as indicated with VII in FIG. 24, and the second analog driven emission layer of the third example finely adjusts a gamma characteristic as indicated with VII in FIG. 24. The second analog driven emission layer is set to adjust the gamma characteristic according to the characteristics and aging of the display.

The analog driven emission layer is superior to the digital driven emission layer in realizing multiple gradation levels, and the digital driven emission layer is superior to the analog driven emission layer in reducing brightness unevenness. The gamma correction is adjustable according to the characteristics of a display.

(Fourth Example of Gradation Expression)

Figure 25:
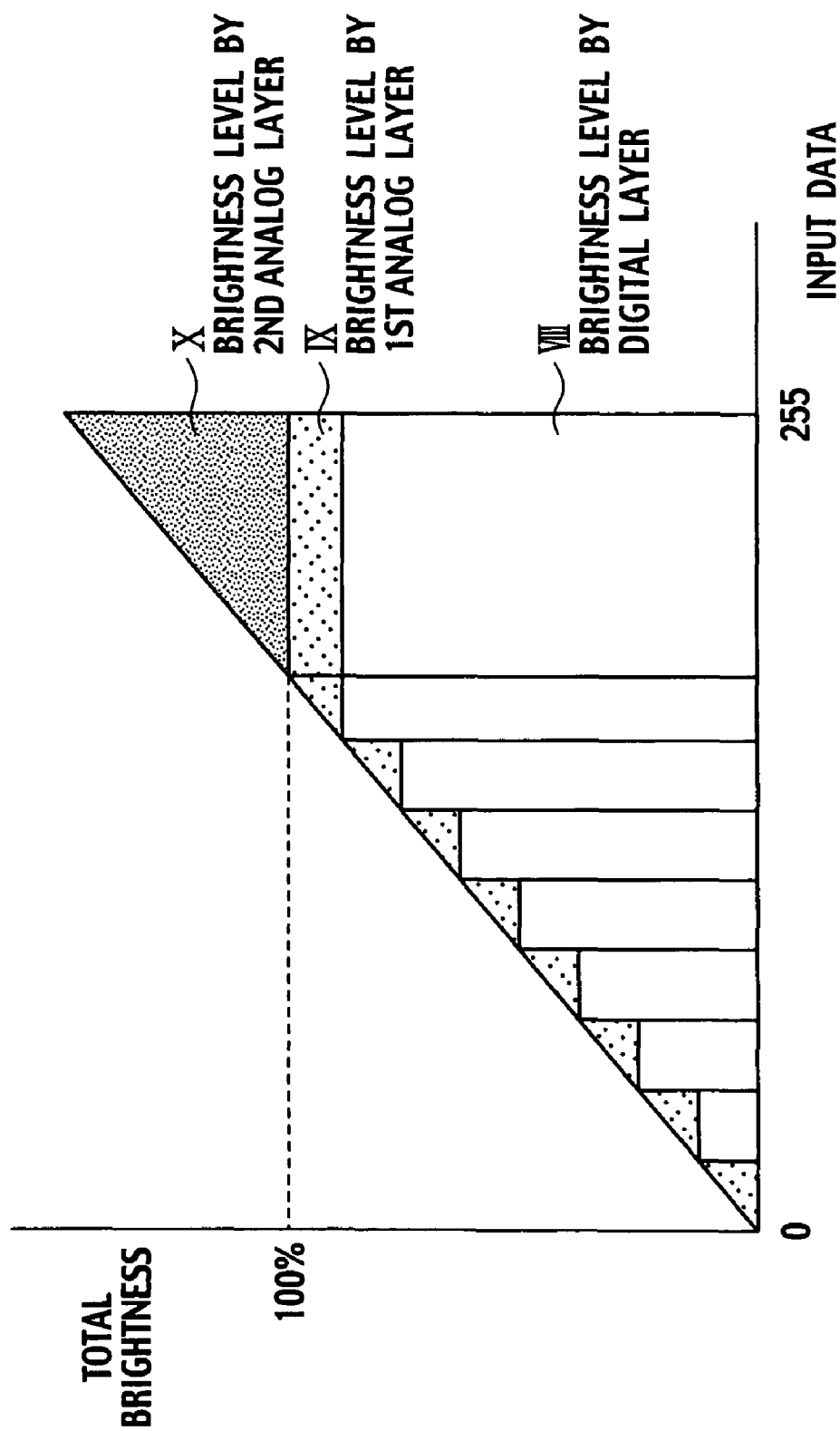
FIG. 25 is a view explaining a fourth example of gradation expression.

FIG. 25 shows a fourth example of gradation expression employing three digital driven emission layers and two analog driven emission layers to form a multilayer pixel structure. The fourth example increases a peak brightness level. A three-layer structure with three digital driven emission layers can only express eight gradation levels including 0. The digital driven emission layers hardly increase a peak brightness level because the digital driven emission layers create large brightness steps as indicated with VIII in FIG. 25.

To solve the problem, the first analog driven emission layer of the fourth example compensates the large gradation steps created by the digital driven emission layers, as indicated with IX in FIG. 25, and the second analog driven emission layer of the fourth example emits light only when input data exceeds a peak brightness of 100%, as indicated with X in FIG. 25.

The analog driven emission layer is superior to the digital driven emission layer in realizing multiple gradation levels, and the digital driven emission layer is superior to the analog driven emission layer in reducing brightness unevenness. Increasing a peak brightness results in providing an image having an impact.

As explained above, a light emitting element according to the third embodiment employs a combination of digital driven emission layers and analog driven emission layers. Compared with an n-layer structure only with n digital driven emission layers, the third embodiment including analog layers can express multiple gradation levels and can correctly display an intended gradation level. Compared with an n-layer structure only with analog driven emission layers, the third embodiment can greatly decrease brightness unevenness over pixels, minimize gradation deviations, and reduce a power loss.

Although the first to fourth examples shown in FIGS. 22 to 25 according to the third embodiment employ a structure with three digital driven emission layers and one or two analog driven emission layers to form a pixel, the present invention is not limited to these examples. The present invention is applicable to structures with more layers.

Fourth Embodiment

Figure 26:
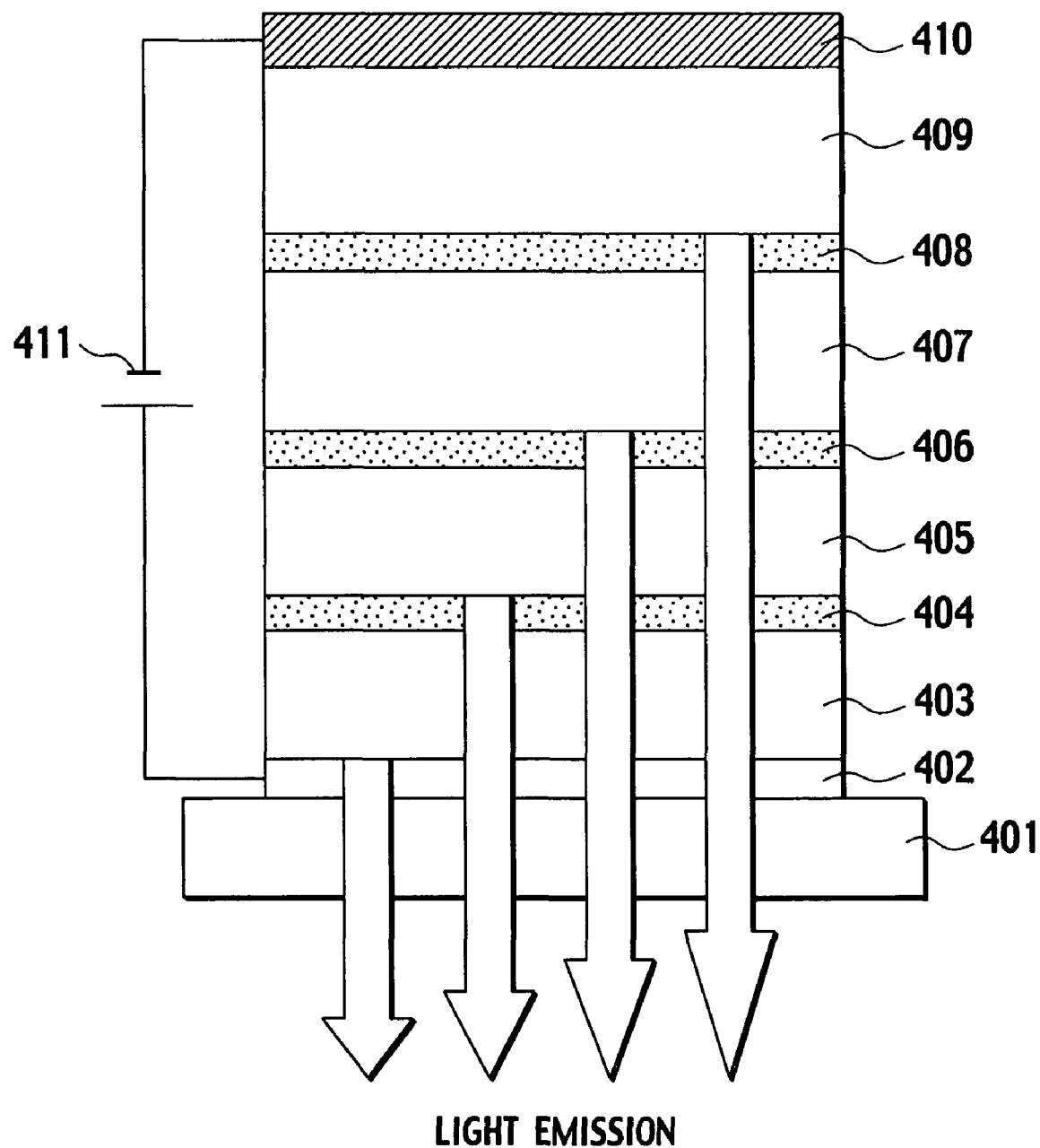
FIG. 26 is a view showing a layer structure of a pixel in a display according to a fourth embodiment of the present invention.

FIG. 26 shows a layer structure of a pixel in a display according to a fourth embodiment of the present invention employing a multiphoton configuration. This display is, for example, an organic EL display. A glass substrate 401 is a screen of the display. The glass substrate 401 may be made of, for example, plastic material if it is useful to form organic film layers thereon. On the glass substrate 401, an anode 402 is formed. The anode 402 is, for example, a transparent ITO electrode.

On the anode 402, an organic emission layer 403 is formed. The organic emission layer 403 is a combination of a hole injection layer, a hole transport layer, an electron injection layer, an electron transport layer, and an emission layer made of organic luminescent compounds (organic emission layers 405, 407, and 409 are the same as the layer 403). The combination must be properly selected according to organic EL characteristics.

On the organic emission layer 403, a charge generation layer 404 is formed. The charge generation layer 404 operates as an injection layer to inject electrons and holes. The charge generation layer 404 may be made of ITO or $V_2O_5$. On the charge generation layer 404, the organic emission layer 405 is formed. On the layer 405, a charge generation layer 406, the organic emission layer 407, a charge generation layer 408, and the organic emission layer 409 are sequentially formed. On the layer 409, a cathode 410 is formed. A power source 411 is connected to the cathode 410 and anode 402.

The display according to the fourth embodiment employs a multilayer structure with the organic emission layers and charge generation layers alternately laid one over another between the anode 402 and the cathode 410. This structure is called a multiphoton structure. In this embodiment, the multiphoton structure sandwiched between the anode 402 and the cathode 410 forms a light emitting unit.

To emit light from the glass substrate 401, the cathode 410 is made of metal such as aluminum to reflect light. A light emitting principle of the organic emission layers 403, 405, 407, and 409 sandwiched between the anode 402 and the cathode 410 is the same as that of the related art. The power source 411 is provided for the anode 402 and cathode 410.

Figure 27:
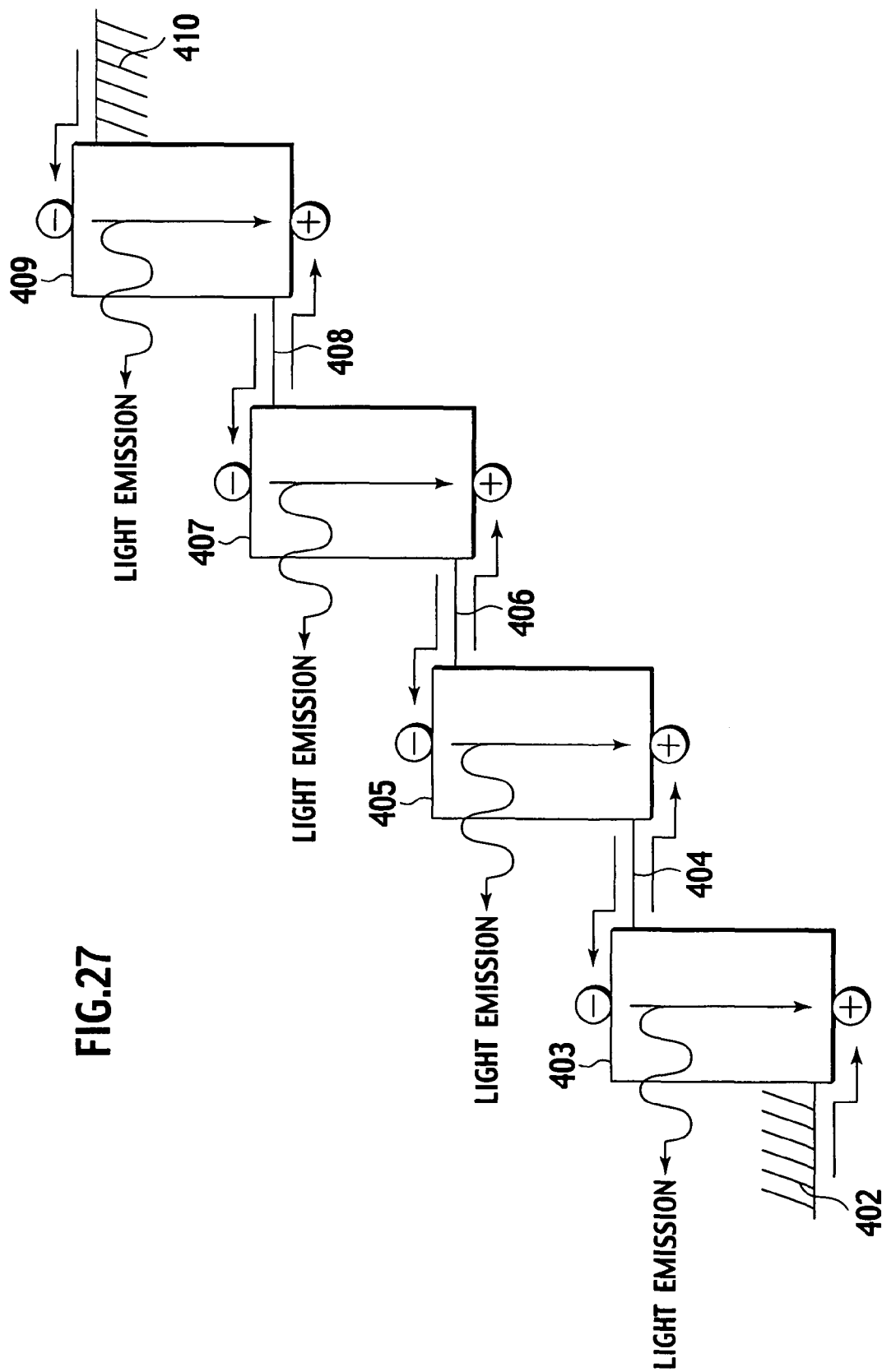
FIG. 27 is a view showing an operational principle of a multiphoton structure.

FIG. 27 shows a principle operation of the multiphoton structure. In FIG. 27, the same parts as those shown in FIG. 26 are represented with the same reference numerals. In FIG. 27, the charge generation layers 404, 406, and 408 function to inject electrons and holes into the adjacent organic emission layers 403, 405, 407, and 409. In these organic emission layers, the electrons and holes recombine to emit light. The brightness of light emitted from the pixel in question in the organic EL display is the sum of brightness of light emitted from the organic emission layers 403, 405, 407, and 409.

In this embodiment, the multiphoton structure includes the four organic emission layers 403, 405, 507, and 409. If these layers are made of light emitting material having the same characteristics and if a voltage to be applied to a single layer is applied to each of the layers, the 4-layer multiphoton structure provides brightness four times as large as a monolayer structure. This means that the multiphoton structure can provide the same brightness level provided by the monolayer structure with one fourth as small current as needed by the monolayer structure. This results in elongating the service life of the multiphoton structure. According to the fourth embodiment, the layers of the multiphoton structure are made of the same material. The layers of the multiphoton structure may be made of different materials, if the layers provide each the same light emitting characteristic.

Figure 28:
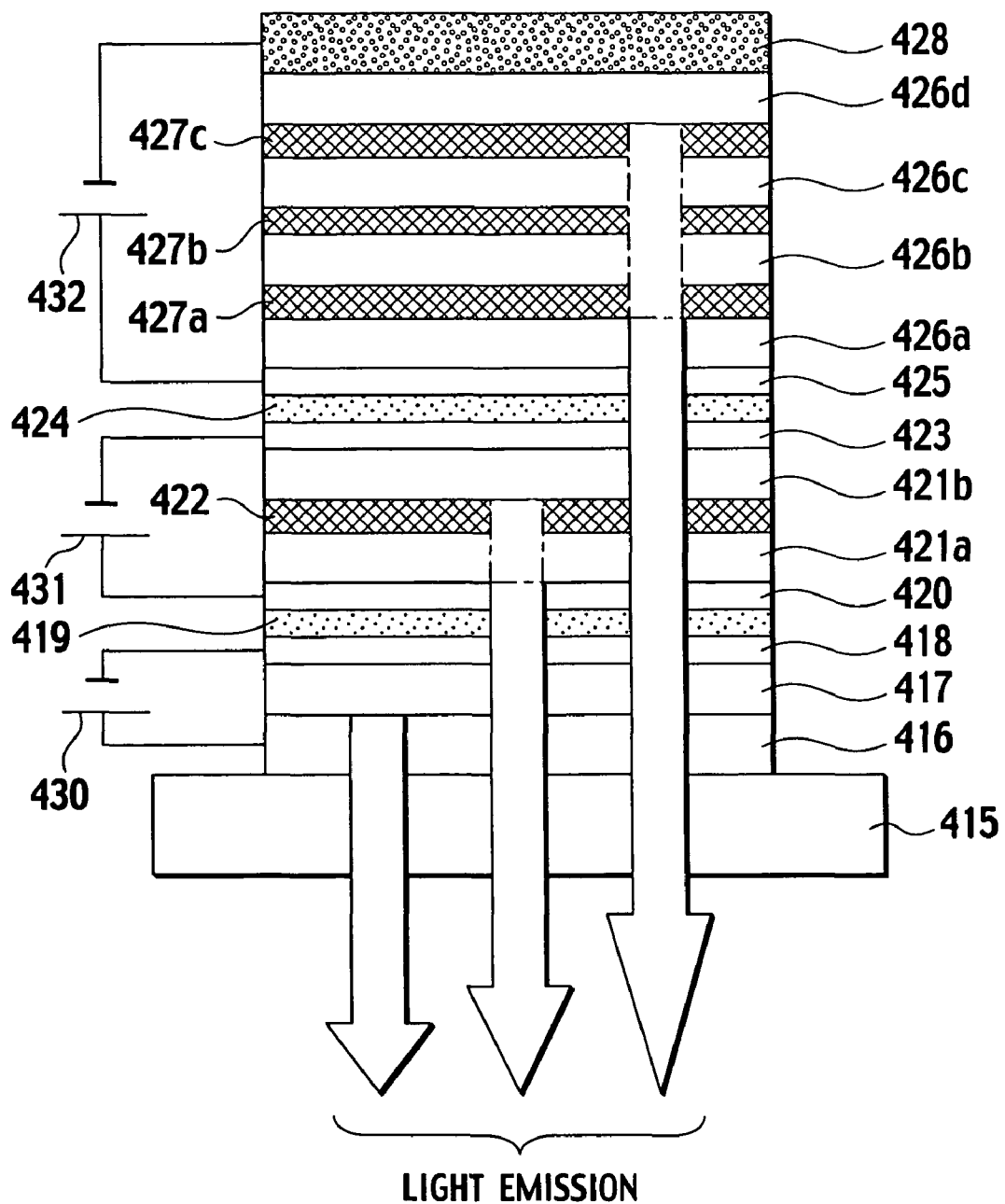
FIG. 28 is a view showing a pixel structure according to the fourth embodiment.

FIG. 28 shows a pixel structure of the display according to the fourth embodiment employing a multiphoton structure. On a glass substrate 415, an anode 416 is formed. On the anode 416, an organic emission layer 417 is formed. The layer 417 has the same structure as that of the related art. On the organic emission layer 417, a cathode 418 is formed. The anode 416 and cathode 418 receive a voltage from a power source 430.

On these layers, a silicon oxide film 419 is formed. The silicon oxide film 419 electrically insulates an anode 420 formed on the film 419 from the cathode 418 formed under the film 419. On the anode 420, an organic emission layer 421a, a charge generation layer 422, an organic emission layer 421b, and a cathode 423 are sequentially formed. The structure between the anode 420 and the cathode 423 is a two-layer multiphoton structure.

The organic emission layers 421a and 421b are made of the same material as that of the organic emission layer 417. When receiving the same voltage, the layers 421a and 421b emit light of the same characteristics. The anode 420 and cathode 423 are connected to a power source 431 that applies a voltage to the electrodes 420 and 423.

On the cathode 423, a silicon oxide film 424 is formed. The silicon oxide film 424 electrically insulates an anode 425 formed on the film 424 from the cathode 423 formed under the film 424. On the anode 425, an organic emission layer 426a, a charge generation layer 427a, an organic emission layer 426b, a charge generation layer 427b, an organic emission layer 426c, a charge generation layer 427c, an organic emission layer 426d, and a cathode 428 are sequentially formed. The structure between the anode 425 and the cathode 428 is a four-layer multiphoton structure.

The organic emission layers 426a to 426d are made of the same material as that of the organic emission layer 417. When receiving the same voltage, the layers 426a to 426d emit light of the same characteristics. The anode 425 and cathode 428 are connected to a power source 432 that applies a voltage to the electrodes 425 and 428. When a top face emission structure that emits light from the cathode 428 is adopted, the cathode 428 is a transparent electrode made of, for example, ITO.

The organic emission layers 417, 421a, 421b, and 426a to 426d emit light whose brightness is proportional to applied currents. The light is emitted from the glass substrate 415. To equalize the brightness of light emitted from the layers 417, 421a, 421b, and 426a to 426d, the same voltage must be applied to these layers by properly setting voltages supplied from the power sources 430, 431, and 432 thereto. Source voltages at the ratio of 1:2:4 are applied to the power sources 430, 431, and 432. The structure of the fourth embodiment is applicable not only to organic EL displays but also to inorganic EL displays. Further, the fourth embodiment is applicable not only to active driving displays but also to passive driving displays.

Each layer of the multiphoton structure emits light of predetermined brightness or no light in response to two values, i.e., ON and OFF of the power source. Namely, according to ON/OFF operation of the power sources, the organic emission layers 417, 421a, 421b, and 426a to 426d are digitally driven.

Figure 29:
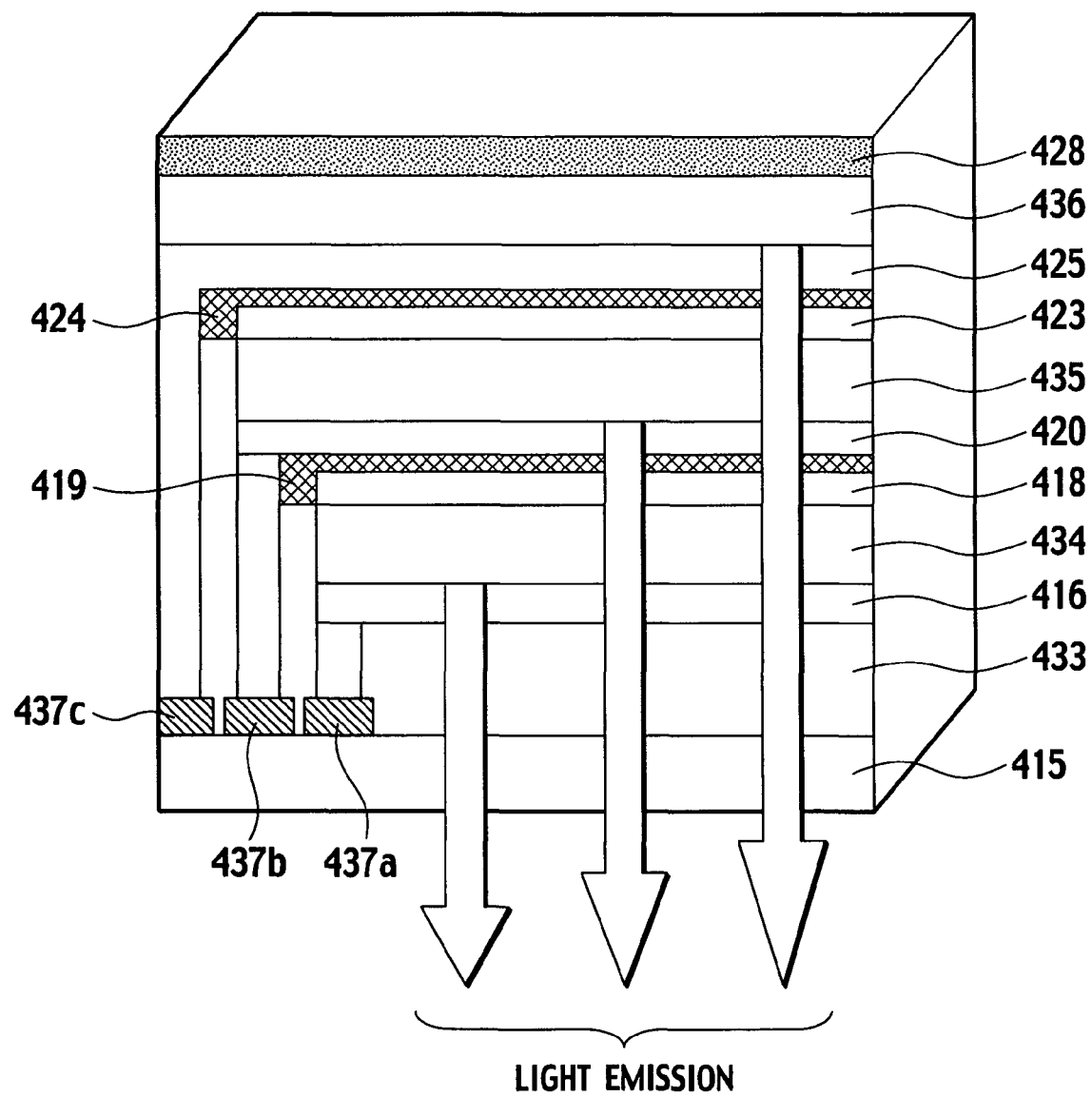
FIG. 29 is a view showing a pixel structure according to the fourth embodiment.

As mentioned above, a multiphoton structure having organic emission layers and charge generation layers held between an anode and a cathode forms a light emitting unit. The display of FIG. 28 has a pixel structure shown in FIG. 29 that shows one of the color dots (for example, red, green, and blue dots) that form a pixel. In FIG. 29, the same parts as those of FIG. 28 are represented with the same reference marks.

On the glass substrate 415 of FIG. 29, the anode 416, light emitting unit 434, and cathode 418 are sequentially formed. On them, there are sequentially formed the silicon oxide film 419, anode 420, light emitting unit 435, and cathode 423. On them, there are sequentially formed the silicon oxide film 424, anode 425, light emitting unit 436, and cathode 428.

The light emitting unit 434 corresponds to the organic emission layer 417. The light emitting unit 435 corresponds to a two-layer multiphoton light emitting part made of the organic emission layer 421a, charge generation layer 422, and organic emission layer 421b. The light emitting unit 436 corresponds to a four-layer multiphoton light emitting part made of the organic emission layer 426a, charge generation layer 427a, organic emission layer 426b, charge generation layer 427b, organic emission layer 426c, charge generation layer 427c, and organic emission layer 426d.

According to the fourth embodiment, a light emitting unit, an anode and a cathode that sandwich the light emitting unit, and a power source that supplies a source voltage to the anode and cathode are collectively called a unit element. Then, the anode 416, light emitting unit 434, cathode 418, and a power source (not shown) form a unit element. Similarly, the anode 420, light emitting unit 435, cathode 423, and a power source (not shown) form a unit element. The anode 425, light emitting unit 436, cathode 428, and a power source (not shown) form a unit element. Accordingly, the pixel of the organic EL display shown in FIG. 29 has a three-layer light emitting element in which three unit elements are stacked one over another in a vertical direction.

On the glass substrate 415, thin film transistors (TFTs) 437a, 437b, and 437c serving as active elements are formed and are connected to the anodes 416, 420, and 425, respectively, as shown in FIG. 29. The TFTs 437a to 437c may be any active elements made of p-Si (low-temperature polysilicon), a-Si (amorphous silicon), organic transistors, or the like if they can drive and control the organic emission layers.

The TFTs 437a to 437c function to turn on and off power supplied from the power sources to the organic emission layers 434 to 436, respectively. Turning on and off the power sources digitally drives the light emitting units (light emitting parts) 434 to 436 so that they emit light or no light.

A silicon oxide film 433 prevents metal ions from migrating from the glass substrate 415 to the anode 416. Although not shown, the cathodes 418, 423, and 428 form a common electrode.

To emit light from the glass substrate 415 that is at the bottom of the pixel, the cathode 428 at the top of the pixel must not leak light. To achieve this, the cathode 428 is made of metal such as aluminum. Light emitted from the light emitting units 434 to 436 advances in upward and downward directions. The light advanced toward the cathode 428 is reflected with the cathode 428 and is oriented toward the bottom of the pixel. Consequently, light is emitted only from the glass substrate 415.

The bottom emission structure emits light from the glass substrate 415 on which the TFTs 437*a* to 437*c* are formed. There is a top emission structure that forms the cathode 428 with a transparent electrode and the anode 416 with metal such as aluminum, to emit light from the cathode 428. The present invention can adopt any one of the top emission and bottom emission structures. A plurality of the TFTs 437*a* to 437*c* are usually needed. The TFTs 437*a* to 437*c* are collectively referred to as an element driver (first driver).

The three-layer light emitting element of FIG. 29 employs the brightness weights of FIG. 7A. A brightness weight is a numerical value relative to a reference value and corresponds to the brightness of light emitted from an organic emission layer.

The light emitting unit 434 shown in FIGS. 28 and 29 is referred to as a first layer, the light emitting unit 435 as a second layer, and the light emitting unit 436 as a third layer. The brightness of the first layer is set as 1, the brightness of the second layer as 2, and the brightness of the third layer as 4. This is because, when the same voltage is applied to each organic emission layer of the multiphoton structure, the brightness of light emitted from each light emitting unit is an integer multiple of the number of organic emission layers contained in the light emitting unit. The brightness of light emitted from each light emitting unit is the brightness of light emitted when a source voltage is applied thereto. Each light emitting unit is digitally driven by turning ON and OFF a source voltage.

FIG. 7B is an example of brightness weights of a light emitting unit having a five-layer structure. The five-layer structure has two more unit elements in addition to the structure shown in FIGS. 28 and 29, i.e., five light emitting units in total. The five light emitting units form first, second, third, fourth, and fifth layers from the light emitting side. Then, as shown in FIG. 7B, the first layer has a brightness value (brightness weight) of 1, the second layer a brightness value of 2, the third layer a brightness value of 4, the fourth layer a brightness value of 8, and the fifth layer a brightness value of 16.

FIG. 8 shows an example of expressing gradation based on the brightness weights shown in FIG. 7A. The example of FIG. 8 has been already explained, and therefore, is not explained again.

Figure 30:
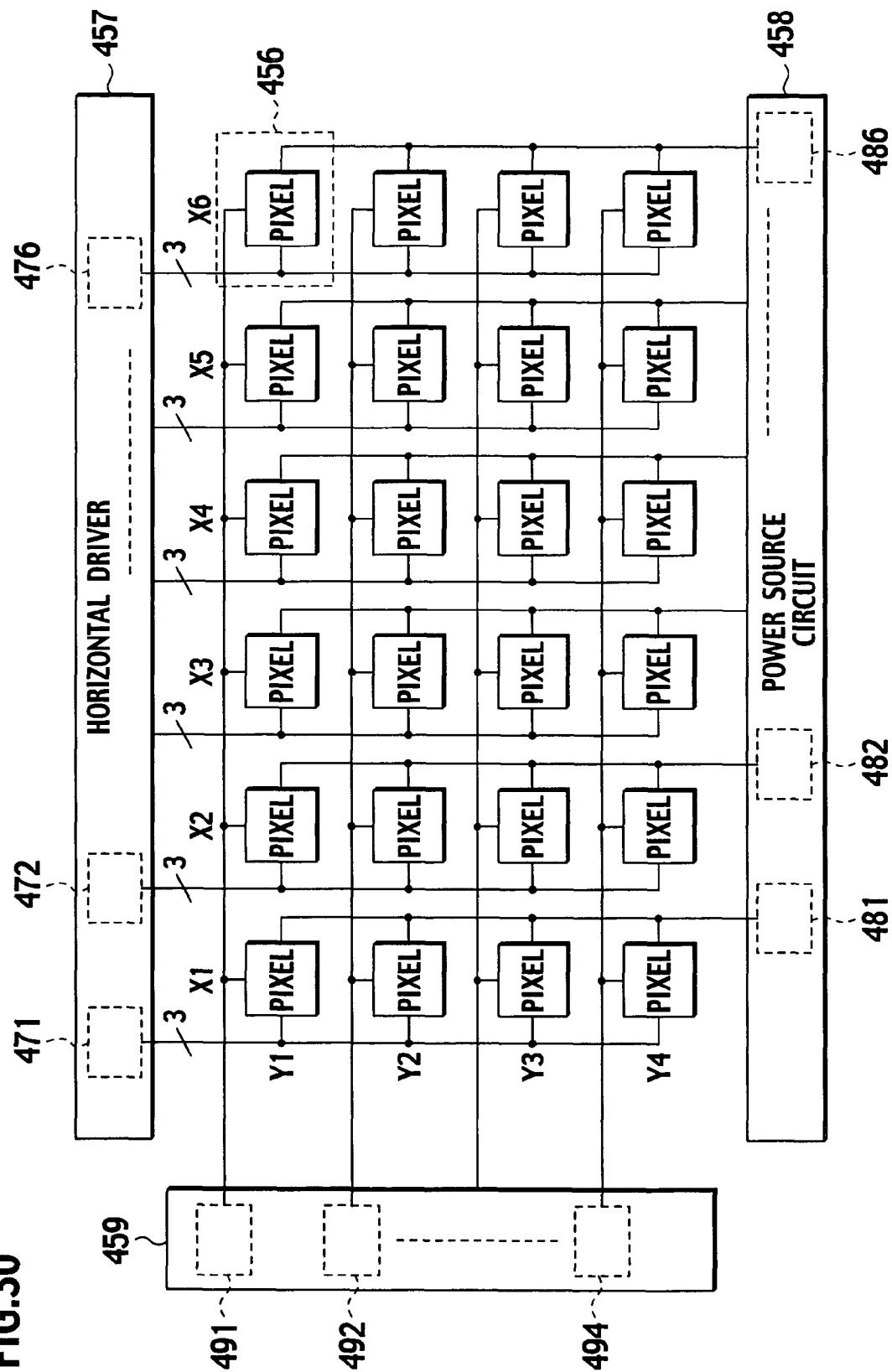
FIG. 30 is a view showing a structure for driving a display panel according to the fourth embodiment.

FIG. 30 is a view showing a structure for driving a display panel of the display according to the fourth embodiment of the present invention. In FIG. 30, each pixel 456 corresponds to a pixel circuit to be explained later with reference to FIG. 31. The display panel includes a plurality of pixels 456 that are arranged in a two-dimensional matrix. A horizontal driver 457 supplies 3-bit digital data to the pixels 456. A power source circuit 458 drives the pixels 456. A vertical driver 459 sequentially selects lines in a vertical direction.

The pixels 456 are in rows Y that are arranged in a vertical direction and in columns X that are arranged in a horizontal direction. The rows Y and columns X form the two-dimensional matrix. According to the example of FIG. 30, the display panel includes four rows Y1 to Y4 and six columns X1 to X6. Although an actual display panel includes more rows and columns, the display panel of FIG. 30 has smaller numbers of rows and columns for the convenience of explanation.

According to the fourth embodiment, the horizontal driver 457 includes data drivers 471 to 476, the power source circuit 458 includes power source units 481 to 486, and the vertical driver 459 includes gate drivers 491 to 494. The horizontal driver 457 and vertical driver 459 collectively serve as a second driver.

To scan the top row Y1 of the display panel in FIG. 30, the gate driver 491 of the vertical driver 459 turns on each pixel 456 in the row Y1. At the same time, the gate drivers 492 to 494 turn off the other rows Y2 to Y4. At this time, the horizontal driver 457 supplies image data for one line to the pixels 456 in the row Y1.

Thereafter, the gate driver 491 turns off the pixels 456 in the row Y1, to display an image on the row Y1. In this way, the vertical driver 459 sequentially drives the gate driver 492 for the row Y2 to the gate driver 494 for the row Y4, and the horizontal driver 457 outputs image data row by row, to scan all pixels 456 in the display panel.

Figure 31:
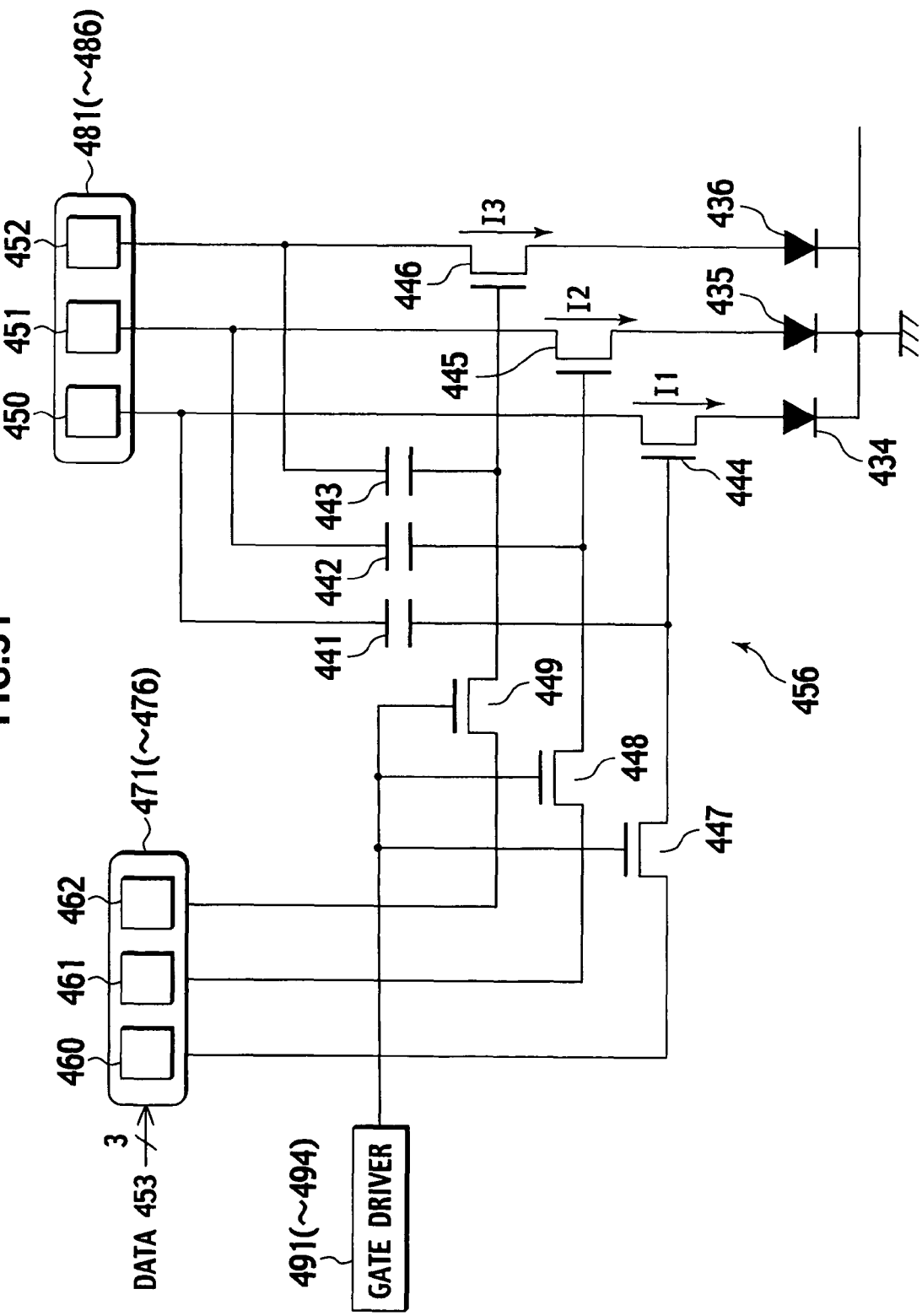
FIG. 31 is a view showing a circuit for driving a pixel according to the fourth embodiment.

FIG. 31 is a circuit diagram showing a circuit for driving a pixel in the display according to the fourth embodiment. In FIG. 31, light emitting diode symbols 434, 435, and 436 correspond to the light emitting units shown in FIG. 29, respectively. The brightness weighs of 1, 2, and 4 shown in FIG. 7A are allocated for these light emitting units.

One ends (anodes in FIG. 31) of the light emitting units 434 to 436 are connected through the sources and drains of driving TFTs 444 to 446 to power sources 450 to 452 that form the power source unit 481. The gates of the TFTs 444 to 446 are connected to the sources of TFTs 447 to 449, respectively, and through capacitors 441 to 443 to the power sources 450 to 452, respectively.

The power sources 450 to 452 may be discrete power sources or may form a common power source. These power sources are set to make the light emitting units 434 to 436 emit light at the respective weights and respective brightness levels. The drains of the TFTs 447 to 449 are connected to data holders 460 to 462 in the data driver 471, and the gates of these TFTs are commonly connected to the gate driver 491.

The structures of the data driver 471, power source unit 481, and gate driver 491 shown in FIG. 31 are also applicable to the data drivers 472 to 476, power source units 482 to 486, and gate drivers 492 to 494 as indicated in FIG. 31. The data drivers 471 to 476, power source units 481 to 486, and gate drivers 491 to 494 drive the pixels 456 in the rows Y and columns X of the display panel.

Operation of the drive circuit of FIG. 31 will be explained. First, data 453 (three bits) with a predetermined gradation level to be displayed on the pixel 456 is supplied to the data driver 471. The data 453 is preferably digital serial data or parallel data. The data 453 supplied to the data driver 471 is used to turn on those of the light emitting units 434, 435, and 436 corresponding to the gradation level to be displayed.

The bits (each being 1 or 0) of the data 453 are stored in the data holders 460 to 462, respectively. The gate driver 491 applies a first potential to the gates of the gate transistors 447 to 449, thereby turning on these gate transistors. The data driver 471 outputs the display data, which is transferred through the drains and sources of the gate transistors 447 to 449 to the capacitors 441 to 443, which store the display data.

Thereafter, the gate driver 491 applies a second potential to the gates of the gate transistors 447 to 449, to turn off these gate transistors. Once the gate transistors 447 to 449 are turned off, the capacitors 441 to 443 hold accumulated charges. The charges held in the capacitors 441 to 443 correspond to the potential differences between the voltages of the power sources 450 to 452 and the output voltages of the data driver 471.

Displaying an image with a gradation level of, for example, 5 on the display will be explained. According to FIG. 8, the gradation level of 5 is achievable by turning on the first and third light emitting units 434 and 436. The input data 453 is converted by the data driver 471 into a data string connected to signal lines of the corresponding light emitting units. In this example, the data holders 460 and 462 hold data to make the light emitting units 434 and 436 emit light.

At this time, the capacitor 441 receives a voltage to turn on the TFT 444, and the capacitor 443 receives a voltage to turn on the TFT 446. As a result, the TFTs 444 and 446 are turned on. On the other hand, the capacitor 442 receives no voltage for driving the TFT 445, and therefore, the TFT 445 is in an OFF state.

Since the TFTs 444 and 446 are ON, currents from the power sources 450 and 452 are passed through the drains and sources of the TFTs 444 and 446 to the light emitting units 434 and 436, which thus emit light. At this time, the light emitting units 434 and 436 have the brightness weights of 1 and 4, respectively, and therefore, the total gradation level of 5 is displayed on the display.

According to the digital driving technique of the display panel of the fourth embodiment, the driving TFTs 444 to 446 are only turned on and off. Accordingly, the circuit configuration of the fourth embodiment is simple with the capacitors 441 to 443 for storing data being used to turn on and off the driving TFTs 444 to 446 and the gate transistors 447 to 449 being used to make the capacitors hold the data.

The driving TFTs 444 to 446 according to the fourth embodiment are only turned on and off. Namely, these transistors are operated in a saturation region. Due to this, the fourth embodiment is free from the problem of threshold variations in active TFTs of the related art. As a result, the fourth embodiment can minimize brightness unevenness and gradation deviation over a display panel.

Operating TFTs in a saturation region reduces a power loss, thereby minimizing power consumption.

The light emitting units 434 to 436 according to the fourth embodiment employ each a multiphoton structure that can provide, with a reduced current to organic emission layers, brightness greater than that provided by the related art. The service life of an organic EL emission layer is inverse proportion to the square of a current value, and therefore, the fourth embodiment can extend the service life of the light emitting units longer than a display employing a conventional circuit configuration.

To achieve digital displaying, the fourth embodiment employs a multiphoton structure for each light emitting unit and forms each emission layer from the same material. With this configuration, the fourth embodiment easily provides a required gradation level as an integer multiple of the number of the organic emission layers.

The first to third or the first to fifth organic emission layers (light emitting units) according to the first to fourth embodiments may be made of the same material or different materials. If the organic emission layers are made of different materials, these layers may receive different current values for different periods, so that the total brightness levels of the first to third layers will be 1, 2, and 4, respectively, as shown in FIG. 7A, and so that the total brightness levels of the first to fifth layers will be 1, 2, 4, 8, and 16, respectively, as shown in FIG. 7B.

Brightness weights assigned to organic emission layers or light emitting units are preferable to be the "n"th power of 2, to reduce the number of the emission layers. This, however, does not limit the present invention. Brightness weights may be assigned to emission layers in an ascending order from a light emitting side as shown in FIGS. 7A and 7B, or in a descending order, or in any other order.

In FIG. 8, each emission layer has a different brightness weight. This does not limit the present invention. For example, each of the first to third emission layers may have the same brightness weight, such as a brightness weight of 1. Alternatively, the emission layers may partly have the same or different brightness weights. For example, the first layer may have a brightness weight of 1 and each of the second and third layers may have a brightness weight of 2.

The present invention is applicable not only to organic EL displays but also to inorganic EL displays. The present invention is also applicable to active driving displays and passive driving displays. The present invention needs no sub-pixels to be prepared for each pixel, and therefore, can sufficiently cope with high-resolution display panels to be developed in the future.

It should be understood that many modifications and adaptations of the invention will become apparent to those skilled in the art and it is intended to encompass such obvious modifications and changes in the scope of the claims appended hereto.

What is claimed is:

1. An emission device comprising:
a light emitting element including "n" (n is a natural number equal to or greater than 2) emission layers laid one over another;
a first driver configured to drive the n emission layers of the light emitting element so that the n emission layers individually emit light or no light;
a second driver configured to drive the n emission layers of the light emitting element so that the n emission layers emit light with their respective bright less weights.

2. The emission device of claim 1, wherein:
the second driver fixes one of a current passing period and current amount applied to the n emission layers and prepares "m" (m is a natural number equal to or smaller than n) kinds of values for the other, to thereby define m brightness weights.

3. The emission device of claim 1, wherein;
the second driver sets "m" (m is a natural number equal to or smaller than n) combinations of a current passing period and a current value applied to the n emission layers, to thereby define m brightness weights.

4. The emission device of claim 1, wherein the second driver has:
a digital driver for digitally driving "m" (m is a natural number equal to or smaller than n) of the n emission layers; and
an analog driver for driving, in an analog mode, "n−m" of the emission layers so that the "n−m" emission layers may emit light of halftone levels.

5. The emission device of claim 1, wherein:
the digital driver prepares m or lower kinds of values for brightness weight for the m emission layers; and
the analog driver sets brightness weights for the "n−m" emission layers so that the m
emission layers and the "n−m" emission layers collectively emit light that expresses the gradation level intended for the dot.

6. An emission device comprising:
a light emitting element having "n" (n is a natural number equal to or greater than 2) unit elements laid one over another, each of the unit elements having an anode, a multiphoton emission part, and a cathode that are sequentially laid one over another, the multiphoton emission part having "m" (m is a natural number) organic emission layers and "m−1" charge generation layers that are alternately laid one over another;

a first driver configured to drive the multiphoton emission parts so that the multiphoton emission parts individually emit light or no light; and a second driver configured to drive the n multiphoton emission parts of the light emitting element so that the n multiphoton emission parts emit light with their respective brightness weights.

7. The emission device of claim 6, wherein: the charge generation layer held between adjacent two of the organic emission layers injects electrons into one of the two organic emission layers and holes into the other.

* * * * *